(12) United States Patent
Hochberg et al.

(10) Patent No.: US 8,554,022 B1
(45) Date of Patent: Oct. 8, 2013

(54) SILICON-GRAPHENE WAVEGUIDE PHOTODETECTORS, OPTICALLY ACTIVE ELEMENTS AND MICROELECTROMECHANICAL DEVICES

(75) Inventors: Michael J. Hochberg, Seattle, WA (US); Jeremy Witzens, La Jolla, CA (US)

(73) Assignee: University of Washington Through Its Center for Commercialization, Seattle, WA (US)

( * ) Notice: Subject to any disclaimer, the term of this patent is extended or adjusted under 35 U.S.C. 154(b) by 95 days.

(21) Appl. No.: 12/974,932

(22) Filed: Dec. 21, 2010

Related U.S. Application Data

(60) Provisional application No. 61/288,811, filed on Dec. 21, 2009.

(51) Int. Cl.
 *G02F 1/01* (2006.01)
(52) U.S. Cl.
 USPC .................. 385/1; 385/122; 257/21; 398/141
(58) Field of Classification Search
 USPC ........... 385/1, 122; 257/21, 29, 76; 398/141; 438/194; 252/511
 See application file for complete search history.

(56) References Cited

U.S. PATENT DOCUMENTS

| | | | |
|---|---|---|---|
| 7,005,669 B1* | 2/2006 | Lee ................................ | 257/21 |
| 7,894,696 B2* | 2/2011 | Baehr-Jones et al. ......... | 385/122 |
| 8,053,782 B2* | 11/2011 | Avouris et al. .................. | 257/76 |
| 2007/0035800 A1* | 2/2007 | Hochberg et al. ............. | 359/237 |
| 2008/0149900 A1* | 6/2008 | Jang et al. ...................... | 252/511 |
| 2011/0042650 A1* | 2/2011 | Avouris et al. .................. | 257/29 |
| 2011/0186817 A1* | 8/2011 | Bowers et al. .................. | 257/29 |
| 2012/0008897 A1* | 1/2012 | Li .................................... | 385/14 |

OTHER PUBLICATIONS

Kim et al, Macmillan Publishers Limited, Nature 457, pp. 706-710, "Large-scale pattern growth of grapheme films for stretchable transparent electrodes", Feb. 5, 2009.*

* cited by examiner

*Primary Examiner* — Ellen Kim
(74) *Attorney, Agent, or Firm* — Dorsey & Whitney LLP

(57) ABSTRACT

Systems and methods for modulating light with light in high index contrast waveguides clad with graphene. Graphene exhibits a large nonlinear electro-optic constant $\chi^3$. Waveguides fabricated on SOI wafers and clad with graphene are described. Systems and methods for modulating light with light are discussed. Optical logic gates are described. Waveguides having closed loop structures such as rings and ovals, Mach-Zehnder interferometer, grating, and Fabry-Perot configurations, are described. Optical signal processing methods, including optical modulation at Terahertz frequencies, are disclosed. Optical detectors are described. Microelectromechanical and nanoelectromechanical systems using graphene on silicon substrates are described.

28 Claims, 27 Drawing Sheets

FIG. 24A
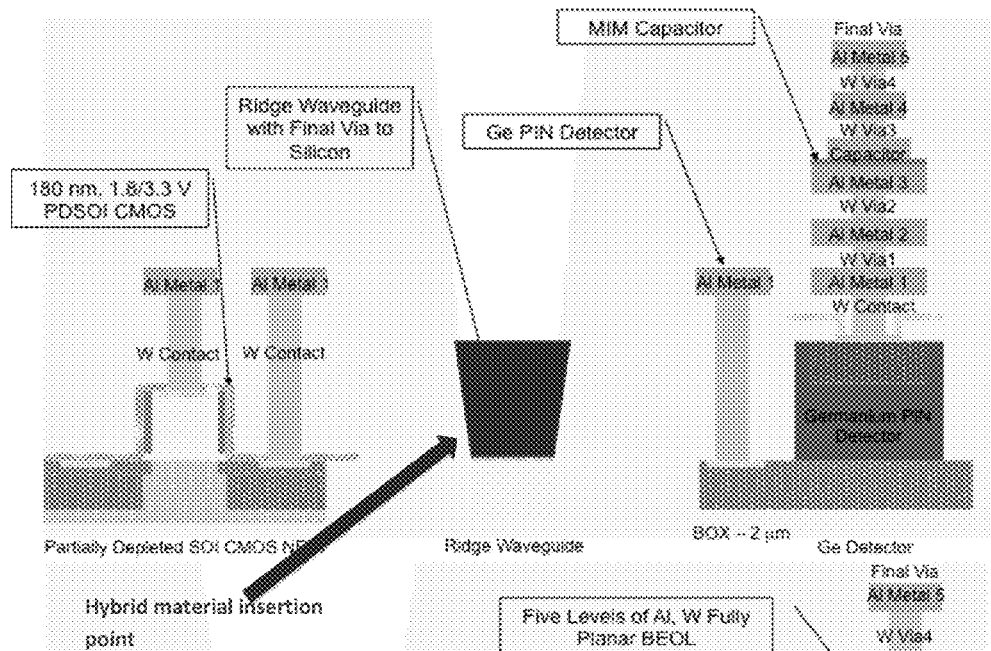
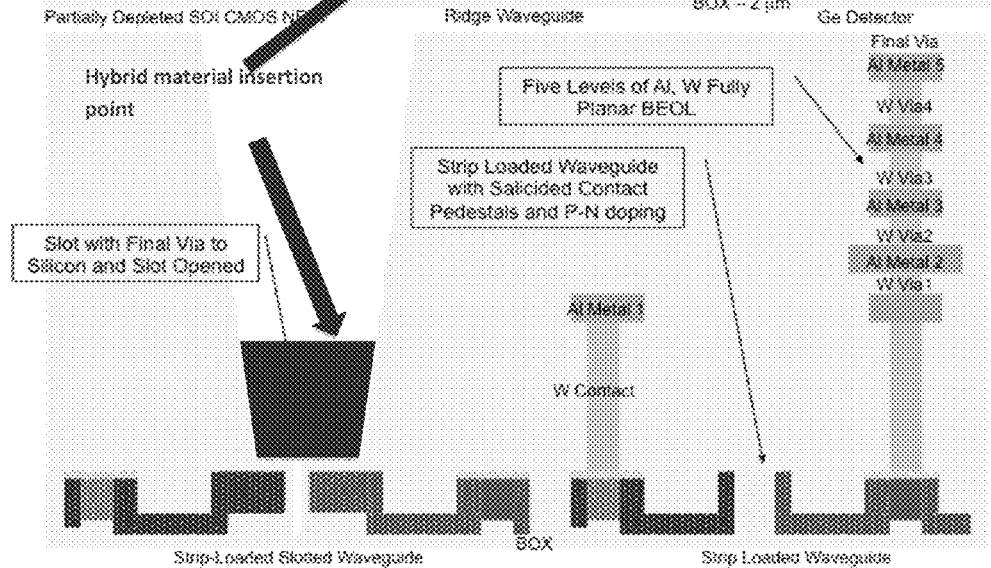
FIG. 24B 200 nm

2 µm

FIG. 27A       FIG. 27B        FIG. 27C
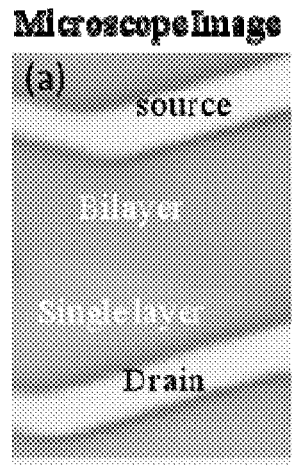
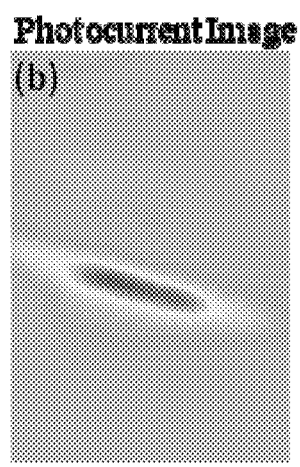
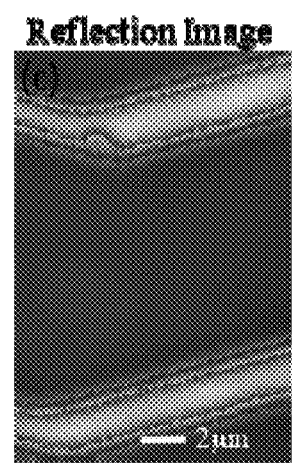
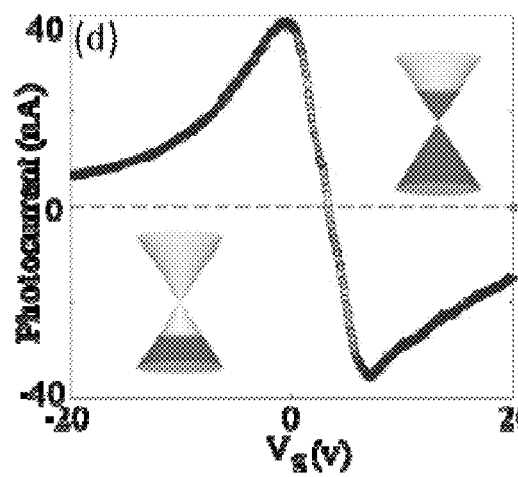
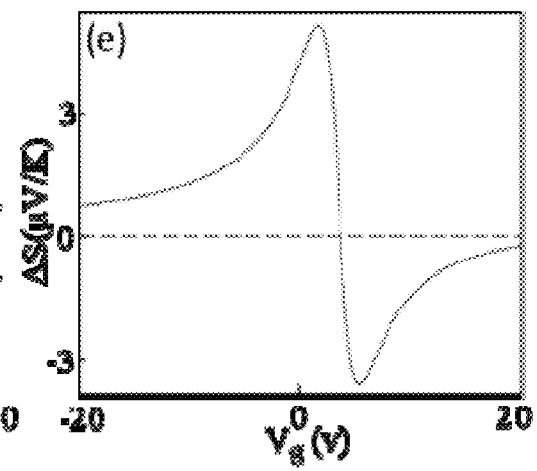
FIG. 27D              FIG. 27E

US 8,554,022 B1

SILICON-GRAPHENE WAVEGUIDE PHOTODETECTORS, OPTICALLY ACTIVE ELEMENTS AND MICROELECTROMECHANICAL DEVICES

CROSS-REFERENCE TO RELATED APPLICATIONS

This application claims priority to and the benefit of co-pending U.S. provisional patent application Ser. No. 61/288,811, filed Dec. 21, 2009, which application is incorporated herein by reference in its entirety.

FIELD OF THE INVENTION

The invention relates to photodetectors, optical modulators and micromechanical devices in general and particularly to those devices that use light to modulate light and that employ graphene materials having large nonlinear optical characteristics.

BACKGROUND OF THE INVENTION

The structure of telecommunications systems today is fundamentally different from that of transistor-based electronics. Broadly speaking, computation is not done today commercially in the optical domain; computation and logic is done with transistor-based logic. Fiber optics are often used for transmitting high speed data streams over longer distances, while slower and shorter-distance communications continues to be dominated by electronic signaling which is often done with copper wires or with short range wireless communication systems, such as WiFi. This is partially a result of the high cost of optical devices, and partially a result of the complexity and cost of the electronics required for high-bit-rate applications.

The very fastest commercially available optical detectors and modulators available today are limited by free-carrier diffusion speeds and by the speed of the supporting electronics to the Gigahertz frequency range. The speeds of such devices have been relatively static for several years, and cannot be expected to increase dramatically in the near future. The electronics to generate high-rate bit streams, and the amplifier electronics required in order to recover high speed signals from high-speed detectors are both quite complex and expensive at speeds exceeding approximately 10 Gb/s.

The field of nonlinear optics is extremely rich in results, and has been around for many years. Basically the premise of nearly all measurements in the field is that one introduces a sufficiently high power flux (or "fluence," a term of art) in an optical material, it is often possible to excite nonlinear behavior, meaning that the properties of the material change with the input optical power. This kind of effect is very often described through the use of, for instance. Chi$^2$ ($\chi^2$) and Chi$^3$ ($\chi^3$) which are material dependent constants that describe the strength of two of the relevant nonlinear optical activities of a material. Some nonlinearities, which are material dependent, will work at the full optical frequency, while others are slower. Recently, engineered organic materials have begun to be used for nonlinear optics, because they can be designed to have extremely large $\chi^2$ and $\chi^3$ moments.

It would be desirable to be able to perform computations or analog signal processing purely in the optical domain, without the data stream having to be converted into an electrical signal by a detector. There is a need for systems and methods that can fully exploit the optical properties of materials that exhibit large $\chi^2$ and $\chi^3$ moments without having to provide excessive amounts of optical power to do so.

SUMMARY OF THE INVENTION

In one aspect, the invention relates to an apparatus for modulating light with light. The apparatus comprises a substrate having an insulating surface; a high index contrast waveguide adjacent the insulating surface, the high index contrast waveguide having a first input port for receiving a first input light beam having a first frequency, a second input port for receiving a second input light beam having a second frequency different from the first frequency, a third input port for receiving a third input light beam with a third frequency different from at least one of the first and second frequencies, and an output port for providing an output light beam; and a graphene cladding adjacent the high index contrast waveguide. The high index contrast waveguide and the graphene cladding are configured so that, when the first input light beam is provided as a first continuous-wave laser beam having a first frequency, and the second input light beam is provided as a second continuous-wave laser beam having a second frequency, the output light beam appearing at the output port includes a modulated signal at the third frequency having a modulation frequency equal to a difference between the first frequency of the first input light beam and the second frequency of the second input light beam.

In one embodiment, one of the first continuous-wave laser beam and the second input light beam is amplitude modulated. In one embodiment, the first and second input light beams are provided at the same input port.

In another aspect, the invention features an apparatus for modulating light with light. The apparatus comprises a substrate having an insulating surface; a high index contrast waveguide adjacent the insulating surface, the high index contrast waveguide having a first input port for receiving a first input light beam having a first frequency, a second input port for receiving a second input light beam having a second frequency different from the first frequency, and an output port for providing an output light beam; and a graphene cladding adjacent the high index contrast waveguide. The high index contrast waveguide and the graphene cladding are configured so that, when the first input light beam is provided with an amplitude modulation at a predefined frequency, and the second input light beam comprises no amplitude modulation, an output light beam includes an amplitude modulation at the predefined frequency on the second light beam at the second frequency.

In one embodiment, apparatus is an optical transistor. In one embodiment, the substrate is a silicon wafer. In one embodiment, the insulating surface is a layer comprises silicon and oxygen. In one embodiment, the high index contrast waveguide adjacent the insulating surface is silicon.

In one embodiment, the high index contrast waveguide is configured as a Mach-Zehnder interferometer having at least two arms. In one embodiment, the first and the second input light beams interact in one arm of the Mach-Zehnder interferometer.

In one embodiment, the apparatus for modulating light with light further comprises an optical cavity that enhances an optical field strength of at least one optical beam.

In one embodiment, the optical cavity that enhances an optical field strength of at least one optical beam comprises a ring configuration. In one embodiment, the optical cavity that enhances an optical field strength of at least one optical beam comprises a grating configuration. In one embodiment, the optical cavity that enhances an optical field strength of at least one optical beam comprises a Fabry-Perot configuration.

In one embodiment, one of the first input light beam and the second input light beam comprises a combination of a first pump light beam having a first pump frequency and a second pump light beam having a second pump frequency, the combination of the first pump light beam and the second pump light beam providing a modulation source beam having a selected frequency corresponding to a difference between the first pump frequency and the second pump frequency.

In one embodiment, an optical logic gate comprises at least one apparatus for modulating light with light. In one embodiment, the logic gate is configured as a NAND gate. In one embodiment, the logic gate is configured as a XOR gate. In one embodiment, a latch comprises at least one optical logic gate. In one embodiment, the logic gate is configured as an AND gate. In one embodiment, the logic gate is configured as an OR gate.

In still another aspect, the invention features an optical detector. The optical detector comprises a substrate having an insulating surface; a high index contrast waveguide adjacent the insulating surface, the high index contrast waveguide having an input port for receiving an input light beam having a first frequency, and an output output port for providing an output signal; and a graphene cladding adjacent the high index contrast waveguide. The optical detector is configured to provide a signal at said output port representative of said input light beam.

In yet another aspect, the invention features a nanoelectromechanical device. The nanoelectromechanical device comprises a substrate having an insulating surface; a high index contrast waveguide adjacent the insulating surface, the high index contrast waveguide having an input port for receiving a non-volatile input electromagnetic signal and an output port for providing an output signal; and a graphene cladding proximate the high index contrast waveguide, the graphene cladding configured to perform a mechanical motion in response to the non-volatile input electromagnetic signal; the nanoelectromechanical device configured to provide a non-volatile output signal at the output port representative of the non-volatile input electromagnetic signal.

In yet another aspect, the invention provides a method of optically processing light. The method comprises the steps of providing a structure that comprises: a substrate having an insulating surface, a high index contrast waveguide adjacent the insulating surface, the high index contrast waveguide having a first input port for receiving a first input light beam having a first frequency, a second input port for receiving a second input light beam having a second frequency different from the first frequency, a third input port for receiving a third input light beam having a third frequency different from at least one of the first frequency and the second frequency, and an output port for providing an output light beam; and a graphene cladding adjacent the high index contrast waveguide; providing a first continuous-wave laser beam having a first frequency; providing a second continuous-wave laser beam having a second frequency different from the first frequency, providing a third continuous-wave laser beam having a third frequency different from at least one of the first frequency and the second frequency, and observing an output light beam at the output port, the output light beam comprises a modulated signal having a modulation frequency equal to a difference between the first frequency of the first input laser beam and the second frequency of the second input laser beam.

In one embodiment, at least two of the first, the second and the third input light beams are provided at the same input port.

In one embodiment, at least one of the steps of providing a first input laser beam having a first frequency, providing a second input laser beam having a second frequency different from the first frequency and providing a third continuous-wave laser beam having a third frequency different from at least one of the first frequency and the second frequency involves providing an input laser beam using an input waveguide that communicates with the high index contrast waveguide with a coupler.

In still another aspect, the invention features a method of optically processing light. The method comprises the steps of: providing a structure that comprises: a substrate having an insulating surface, a high index contrast waveguide adjacent the insulating surface, the high index contrast waveguide having a first input port for receiving a first input light beam having a first frequency, a second input port for receiving a second input light beam having a second frequency different from the first frequency, and an output port for providing an output light beam; and a graphene cladding adjacent the high index contrast waveguide; providing a first input light beam having a first frequency, and having an amplitude modulation at a predefined frequency; providing a second unmodulated input light beam having a second frequency different from the first frequency, and observing an output light beam having an amplitude modulation at the predefined frequency on the second light beam at the second frequency.

In one embodiment, at least one of the steps of providing a first input light beam having a first frequency and providing a second input light beam having a second frequency different from the first frequency involves providing either input light beam using an input waveguide that communicates with the high index contrast waveguide with a coupler.

As described in greater detail herein, the present invention provides methods and structures that exhibit enhancement of the nonlinear effects in various electro-optical materials that is sufficient to make the nonlinear effects accessible with continuous-wave, low-power lasers. As is described herein the waveguide is coated or clad with graphene which provides or exhibits an enhanced nonlinear optical coefficient. It is to be understood that if the high contrast waveguide core material itself exhibits a sufficiently large nonlinear optical coefficient of the correct order, for example, a $\chi^2$ or a $\chi^3$ coefficient, the cladding may be omitted and the waveguide core itself can provide the nonlinear optical effects of interest. We have demonstrated that some designs of high index contrast waveguides are designed to concentrate light in the cladding. In some embodiments, the waveguide is a split waveguide (also referred to as a slot waveguide). In some embodiments, the split waveguide is coated or clad with graphene which provides an enhanced nonlinear optical coefficient. In some embodiments, the two sides of the split waveguide also comprise electrodes that are used for polling a $\chi^2$ material introduced into the gap. As described herein, in some embodiments, the dispersion of a waveguide is engineered to enhance the optical power in the mode by slowing the propagation of the light. In some embodiments the waveguides are segmented waveguides. As discussed herein, the waveguide can provide optical field enhancement when the structure is arranged into a resonator, which in various embodiments can be either a ring resonator or a linear resonator. In some embodiments, the systems and methods of the invention can be used to provide a tunable infrared source. In some embodiments, by using a low power tunable laser and a high power fixed wavelength laser as the inputs, it is possible to produce a high power coherent tunable source. The tunable source can be a widely tunable coherent source. In addition, using systems and methods of the invention, the use of an incoherent input light source can result in an incoherent tunable source. With the provision of on-chip feedback, the systems and methods of the invention can be used to provide devices that exhibit optical self-oscillation. In some embodiments, the central high index waveguide comprises an amplifying medium, such as a gallium arsenide stripe laser. In some embodiments, where the cladding material exhibits nonlinearities, the laser can be operated as a pulsed source. In some embodiments, systems and methods of the invention can be constructed to provide optical logic functionality, such as optical AND or optical flip-flops. It is believed that systems and method according to the invention can be employed to create optical NAND, OR, NOR and XOR gates, and optical latches, or optical memory. In some embodiments, the systems of the invention can further comprise pump lasers integrated onto the same chip. In some embodiments, the systems of the invention can further comprise off-chip feedback or amplification for frequency conversion or pulse generation. In some embodiments, an additional electrical signal is coupled into the structure to provide active modelocking.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 10C is a diagram that shows a plot of modal patterns over four periods of a segmented waveguide on a horizontal plane that intersects the silicon layer halfway through.

FIG. 24A is a cross-sectional diagram showing how a graphene element can be combined with a ridge waveguide in an integrated circuit environment.

FIG. 24B is a cross-sectional diagram showing how a graphene element can be combined with a slot waveguide in an integrated circuit environment.

FIG. 27A is a microscope image of a graphene interface junction FET device.

FIG. 27B is a photocurrent image of the device shown in FIG. 27A. A pronounced PC arises at the graphene interface junction.

FIG. 27C is a reflection image of the device shown in FIG. 27A.

FIG. 27D is a graph showing the PC amplitude as a function of back gate voltage.

FIG. 27E is a graph of the calculated thermal electrical power difference at the graphene interface junction as a function of gate voltage. It matches the sign and lineshape of PC data very well.

DETAILED DESCRIPTION

Figure 1:
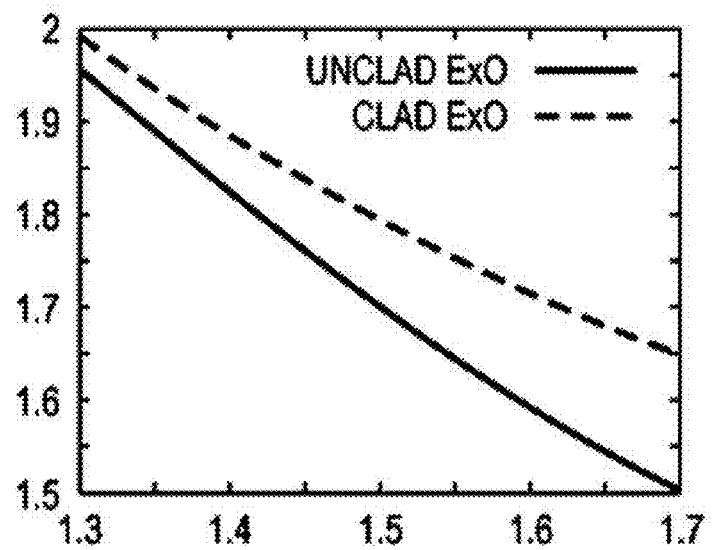
FIG. 1 is a diagram showing dispersion plots for the fundamental mode (Ex polarized) of exemplary clad and unclad waveguides, shown as effective index vs. wavelength in μm.

We now describe high index contrast waveguides that are useful to concentrate light in order to enhance nonlinear optical effects in various materials so that such effects can be employed to manipulate light (or more generally electromagnetic radiation) at low power levels, as compared to conventional systems and methods that employ nonlinear optical materials. The manipulation of electromagnetic radiation or light can be useful to provide a variety of components that perform operations on light such as rectification, modulation, filtering, and logic operations in a manner analogous to the same operations which are provided using electronic devices operating on electrical signals. For example, an input a light wave to be processed is impressed onto the component. The light wave has at least one parameter characterizing the light wave, such as one of an intensity, a polarization, a frequency, a wavelength, and a duration (e.g., a pulse length, or in the case of continuous wave light, an effectively infinite duration). After the input light wave is processed (or interacts with the waveguide and the clad nonlinear optical material adjacent to the waveguide when present), an output signal is observed. In a circumstance where the input signal has been processed, the output signal has at least one parameter that is different from at least one parameter characterizing the input light wave, including possibly an electrical output signal when the input light wave had no electrical signal component (e.g., optical rectification).

We have developed a set of tools for concentrating light to a high degree by using silicon or other high index contrast waveguides, and we have fabricated devices that demonstrate some of the many applications that can be contemplated when such nonlinear materials are exploited. In particular, by utilizing split waveguides, we are able to greatly enhance the optical fields in the cladding of a tightly confined waveguide, without greatly enhancing the optical losses of the same waveguide. Combining the high field concentrations available from the split waveguides with the high nonlinear activity of nonlinear optical polymers permits the development of nonlinear optical devices operating at much lower optical input power levels than are possible with conventional free space or chip based systems. We have demonstrated four-wave mixing (which is based upon $\chi^3$), as well as optical rectification (based on $\chi^2$), in such waveguides. Using these waveguides it is possible to decrease the power levels needed to observe significant nonlinearities to the point where, by contrast with conventional nonlinear optics, it can be done with non-pulsed, continuous wave lasers.

Chi2 ($\chi^2$) and Chi3 ($\chi^3$) based optical effects can be used in particular to build on-chip optical parametric oscillator ("OPO") systems, where two input wavelengths can be mixed together to produce sum and difference frequencies. These frequencies can be either higher or lower than the input frequencies, and can be made tunable. These effects work for frequencies from the ultraviolet and X-ray regime all the way out into the far infrared and microwave, and in fact can work down to DC in some cases, particularly with optical rectification.

The material of which the high index waveguide is made can be any material having a high index that is reasonably transparent at the wavelengths of interest. This can include but is not limited to silicon, gallium nitride, indium phosphide, indium gallium nitride, gallium phosphide, diamond, sapphire, or the various quaternary III/V and II/VI materials such as aluminum gallium arsenide phosphide. III/V denotes materials having at least one element from column III of the periodic table of elements (or an element that is stable as a positive trivalent ion) and at least one element from column V (or an element that is stable as a negative trivalent ion). Examples of III/V compounds include BN, AlP, GaAs and InP. II/VI denotes materials having at least one element from column II of the periodic table of elements (or an element that is stable as a positive divalent ion) and at least one element from column VI (or an element that is stable as a negative divalent ion). Examples of II/VI compounds include MgO, CdS, ZnSe and HgTe.

We present successively the mechanical structure of exemplary embodiments of high index waveguides, exemplary embodiments of cladding materials having large nonlinear constants $\chi^2$ and $\chi^3$ and their incorporation into devices having high index waveguides, and some exemplary results observed on some of the fabricated devices that are described.

Exemplary High Index Waveguide Structures

High-Q Ring Resonators in Thin Silicon-On-Insulator

Resonators comprising high-Q microrings were fabricated from thin silicon-on-insulator (SOI) layers. Measured Q values of 45,000 were observed in these rings, which were then improved to 57,000 by adding a PMMA cladding. Various waveguide designs were calculated, and the waveguide losses were analyzed.

Microring resonator structures as laser sources and as optical filter elements for dense wavelength division multiplexing systems have been studied in the past. The silicon-on-insulator (SOI) structure described here is particularly advantageous. It has low waveguide loss. One can extrapolate an uncoupled Q value of 94,000 and a waveguide loss of 7.1 dB/cm in the unclad case, and −6.6 dB/cm in the PMMA clad case, from the respective measured Q values of 45,000 and 57,000. Although higher Q values have been obtained for optical microcavities, we believe that our geometry has the highest Q for a resonator based on a single mode silicon waveguide. It is also noteworthy that a large amount of power appears outside the core silicon waveguide, which may be important in some applications. The modes that are described herein have approximately 57% of the power outside the waveguide, as compared to 20% for a single-mode 200-nm-thick silicon waveguide, and 10% for a single-mode 300-nm-thick silicon waveguide.

In one embodiment, wafer geometries were selected that minimize the thickness of the SOI waveguiding layer as well as the buried oxide, but still yield low loss waveguides and bends. A number of different waveguide widths were compared by finite difference based mode solving. The geometry used in the exemplary embodiment comprises a 500-nm-wide waveguide formed in a 120-nm-thick silicon layer, atop a 1.4 µm oxide layer, which rests on a silicon handle, such as a silicon wafer as a substrate. Such a configuration supports only a single well-contained optical mode for near infrared wavelengths. The dispersion characteristics are shown in FIG. 1 for both unclad and PMMA-clad waveguides. Our interest in unclad structures stems from the ease of fabrication, as detailed in the following, as well as the flexibility an open air waveguide may provide for certain applications.

These modes were determined by using a finite difference based Hermitian eigensolver. It is possible to calculate the loss directly from the mode pattern with an analytic method valid in the low-loss limit. The waveguide loss at 1.55 µm calculated in such a fashion is approximately −4.5 dB. This loss figure was in agreement with the extrapolated results of FDTD simulation.

Because a loss of −4 dB/cm is attributed to substrate leakage, the waveguide loss can be improved by the addition of a cladding, which tends to pull the mode upwards. This notion is supported by the measured decrease in waveguide loss upon the addition of a PMMA cladding. It can be shown that the substrate leakage loss attenuation coefficient is nearly proportional to $$e^{-2\sqrt{n_{eff}^2 - n_o^2}\, k_0 A}$$

if $k_0$ is the free space wave number, $n_{eff}$ is the effective index of the mode, $n_0$ is the effective index of the oxide layer, and A is the thickness of the oxide. In the present case, the e-folding depth of the above-mentioned function turns out to be 180 nm, which explains why the substrate leakage is so high.

SOI material with a top silicon layer of approximately 120 nm and 1.4 µm bottom oxide was obtained in the form of 200 mm wafers, which were manually cleaved, and dehydrated for 5 min at 180° C. The wafers were then cleaned with a spin/rinse process in acetone and isopropanol, and air dried. HSQ electron beam resist from Dow Corning Corporation was spin coated at 1000 rpm and baked for 4 min at 180° C. The coated samples were exposed with a Leica EBPG-5000+ electron beam writer at 100 kV. The devices were exposed at a dose of 4000 pc/cm$^2$, and the samples were developed in MIF-300 TMAH developer and rinsed with water and isopropanol. The patterned SOI devices were subsequently etched by using an Oxford Plasmalab 100 ICP-RIE within 12 mTorr of chlorine, with 800 W of ICP power and 50 W of forward power applied for 33 s. Microfabricated devices such as the one shown in FIG. 2 were tested by mounting the dies onto an optical stage system with a single-mode optical fiber array. A tunable laser was used first to align each device, and then swept in order to determine the frequency domain behavior of each of the devices. Light was coupled into the waveguides from a fiber mode by the use of grating couplers. Subsequently the devices were spin-coated with 11% 950 K PMMA in Anisole, at 2000 rpm, baked for 20 min at 180° C., and retested.

The theoretical development of the expected behavior of a ring resonator system has been described in the technical literature. In the present case the dispersion of the waveguide compels the addition of a dispersive term to the peak width. We take to be the free space wavelength of a resonance frequency of the system, $n_o$ to be the index of refraction at this wavelength, $(\delta n/\delta \lambda)_0$, the derivative of n with respect to $\lambda$ taken at $\lambda_0$, L to be the optical path length around the ring, a to be the optical amplitude attenuation factor due to loss in a single trip around the ring, and finally t to be the optical amplitude attenuation factor due to traveling past the coupling region. In the limit of a high Q, and thus $(1-\alpha) \ll 1$ and $(1-t) \ll 1$, we have $$Q = (\pi L/\lambda_0)[n_0 - \lambda_0(\delta n/\delta \lambda)_0]/(1-\alpha t) \quad (1)$$

Figure 2:
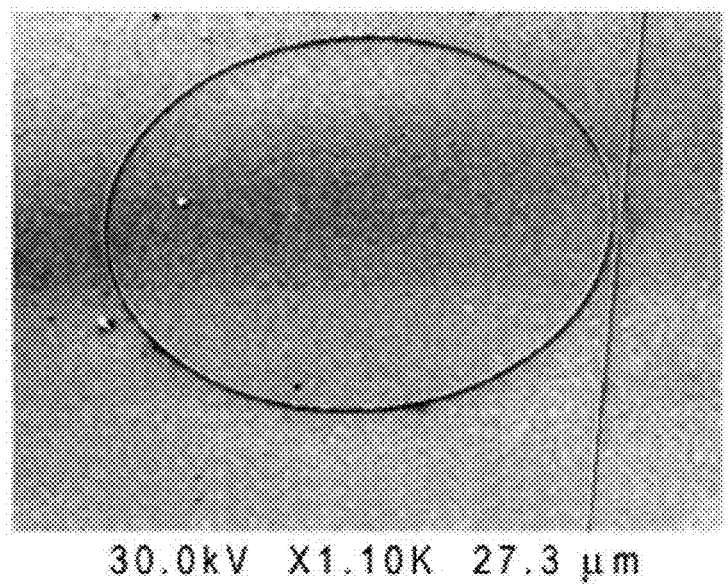
FIG. 2 is a diagram showing an SEM image of an exemplary ring resonator.
Figure 3:
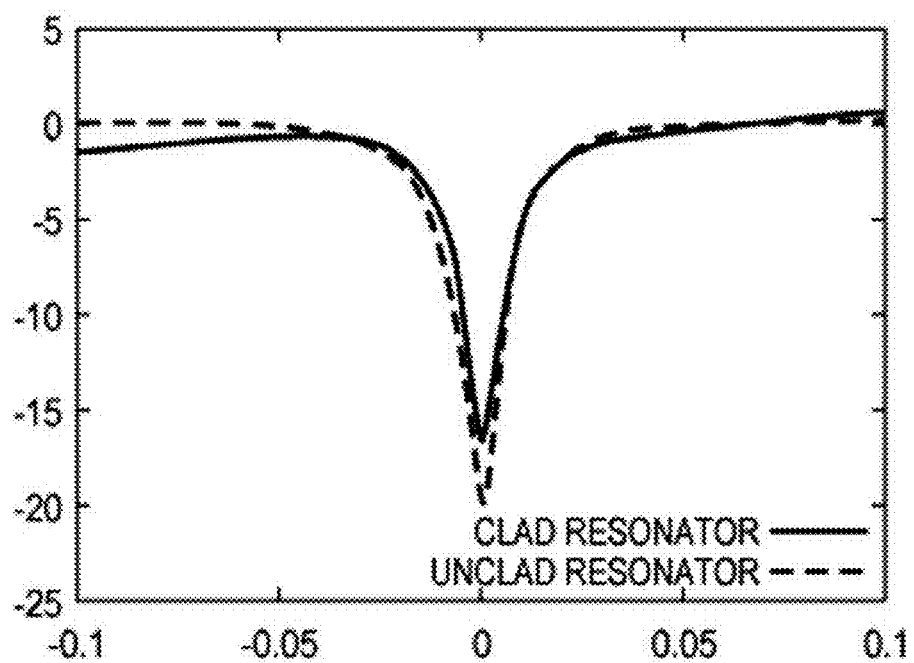
FIG. 3 is a diagram showing the normalized transmission of light through the system (and past the ring) in dB, as a function of wavelength detuning in nm for both clad and unclad waveguides, shifted to overlay resonance peaks.

The waveguide mode was coupled into a ring resonator from an adjacent waveguide. As shown in FIG. 2, the adjacent waveguide can in some embodiments be a linear waveguide. The strength of coupling can then be lithographically controlled by adjusting the distance between the waveguide and the ring. This ring was fabricated with a radius of 30 µm, a waveguide width of 500 nm, and a separation between ring and waveguide of 330 nm. For the clad ring presented, the measured Q is 45,000, and the extinction ratio is −22 dB, for the resonance peak at 1512.56 nm. The PMMA clad ring had a similar geometry, and achieved a Q of 57,000, but with an extinction ratio of −15.5 dB. Typical observed transmission spectra are shown in FIG. 3. The typical amount of optical power in the waveguide directly coupling into the resonator was about 0.03 mW. A dependence of the spectrum on this power was not observed, to within an order of magnitude.

From the mode-solving results for the unclad waveguides, we have $(\lambda n/\delta \lambda)(1.512) = -1.182$ µm$^{-1}$, and $n(\lambda=1.512)=1.688$. Using this result and the earlier relations, the waveguide loss can be calculated from the measured Q value. Specifically, an extinction that is at least −22 dB indicates that a critically coupled Q in this geometry is greater than 38,500, which then implies a waveguide loss of less than −7.1 dB/cm. In similar fashion, the PMMA clad waveguide resonator with a Q of 57,000 but only −15.5 dB of extinction allows a worst case waveguide loss of −6.6 dB/cm. This also implies an instrinsic Q of 77,000 for the unclad resonator, and an intrinsic Q of 94,000 for the PMMA clad resonator.

These devices have a slight temperature dependence. Specifically, the resonance peak shifts correspondingly with the change in the refractive index of silicon with temperature, moving over 2 nm as temperature shifts from 18 to 65° C. The Q rises with higher temperatures slightly, from 33 k at 18° C. to 37 k on one device studied. This shift can probably be explained entirely by the dependence of Q on the effective index.

High-Q Optical Resonators in Silicon-on-Insulator Based Slot Waveguides

We now describe the design, fabrication and characterization of high Q oval resonators based on slot waveguide geometries in thin silicon on insulator material. Optical quality factors of up to 27,000 were measured in such filters, and we estimate losses of −10 dB/cm in the slotted waveguides on the basis of our resonator measurements. Such waveguides enable the concentration of light to very high optical fields within nano-scale dimensions, and show promise for the confinement of light in low-index material with potential applications for optical modulation, nonlinear optics and optical sensing. As will be appreciated, the precise geometry of a resonator (or other kinds of devices) is frequently a matter of design, and the geometry can be varied based on such considerations as length of waveguide, area of a chip, and required interaction (or required non-interaction), such as coupling (or avoiding coupling) with other waveguide structures that are present in a device or on a chip. In some embodiments, the waveguide can be a closed loop, such as at least one ring or at least one oval shaped endless stripe. As has been explained, optical energy can be provided to such a closed loop, for example with an input waveguide.

One can form high quality factor ring or oval resonators in SOI. In these SOI waveguides, vertical confinement of light is obtained from the index contrast between the silicon core and the low index cladding (or air) and the buried silicon dioxide layer, whereas lateral confinement can be obtained by lithographically patterning the silicon. The majority of the light tends to be guided within the silicon core in such waveguide. Although the high refractive index contrast between silicon and its oxide provide excellent optical confinement, guiding within the silicon core can be problematic for some applications. In particular, at very high optical intensities, two-photon absorption in the silicon may lead to high optical losses. Moreover, it is often desirable to maximize the field intensity overlap between the optical waveguide mode and a lower index cladding material when that cladding is optically active and provides electro-optic modulation or chemical sensing.

One solution to these problems involves using a slot waveguide geometry. In a slot waveguide, two silicon stripes are formed by etching an SOI slab, and are separated by a small distance. In one embodiment, the separation is approximately 60 nm. The optical mode in such a structure tends to propagate mainly within the center of the waveguide. In the case of primarily horizontal polarization, the discontinuity condition at the cladding-silicon interface leads to a large concentration of the optical field in the slot or trench between the two stripes. One can predict that the electric field intensity would be approximately $10^8 \sqrt{P}$ V/m where P is the input power in watts. One design uses a 120 nm silicon on insulator layer and 300 nm wide silicon strips on top of a 1.4 µm thick buried oxide layer, which is in turn deposited on a silicon substrate. Various widths for the central slot were fabricated to provide test devices with 50, 60 and 70 nm gaps. Slots larger than 70 nm have also been fabricated and were shown to work well.

In the 1.4-1.6 µm wavelength regime, the waveguide geometry is single mode, and a well-contained optical mode is supported between the two silicon waveguide slabs. There is some loss that such an optical mode will experience even in the absence of any scattering loss or material absorption due to leakage of light into the silicon substrate. The substrate loss can be estimated semi-analytically via perturbation theory, and ranges from approximately −0.15 dB/cm at 1.49 µm to about −0.6 dB/cm at 1.55 µm for the SOI wafer geometry of the present embodiment.

Figure 4:
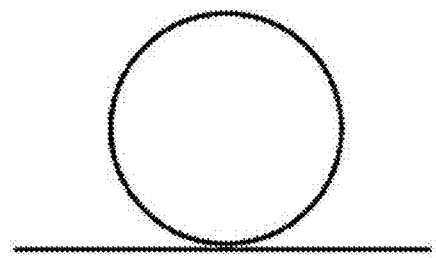
FIG. 4 is a diagram showing the device layout of an exemplary slot waveguide.

Oval resonators were fabricated by patterning the slot waveguides into an oval shape. An oval resonator geometry was selected in preference to the more conventional circular shape to enable a longer coupling distance between the oval and the external coupling waveguide or input waveguide. See FIG. 4. Slots were introduced into both the oval and external coupling waveguides.

Predicting coupling strength and waveguide losses for such devices is not easy. Many different coupling lengths and ring to input waveguide separations were fabricated and tested. It is well known that the most distinct resonance behavior would be observed for critically coupled resonators, in which the coupling strength roughly matches the round trip loss in the ring.

An analytic expression for the quality factor of a ring resonator was presented in equation (1) hereinabove.

Also, the free spectral range can be calculated via:

$$\Delta\lambda=(\lambda_0/L)/[1/L+n_0/\lambda_0-(\delta n/\delta\lambda)_0] \qquad (2)$$

Here, L is the round trip length in the ring, and $n_0$ and $\lambda_0$ are the index of refraction, and the wavelength at resonance, respectively. The derivative of the effective index with respect to the wavelength at the resonance peak is given by $(\delta n/\delta\lambda)_0$, and it can be shown that this term is roughly equal to −0.6 $\mu m^{-1}$ from the 1.4-1.6 µm spectral range for the slot waveguides studied here.

Figure 5:
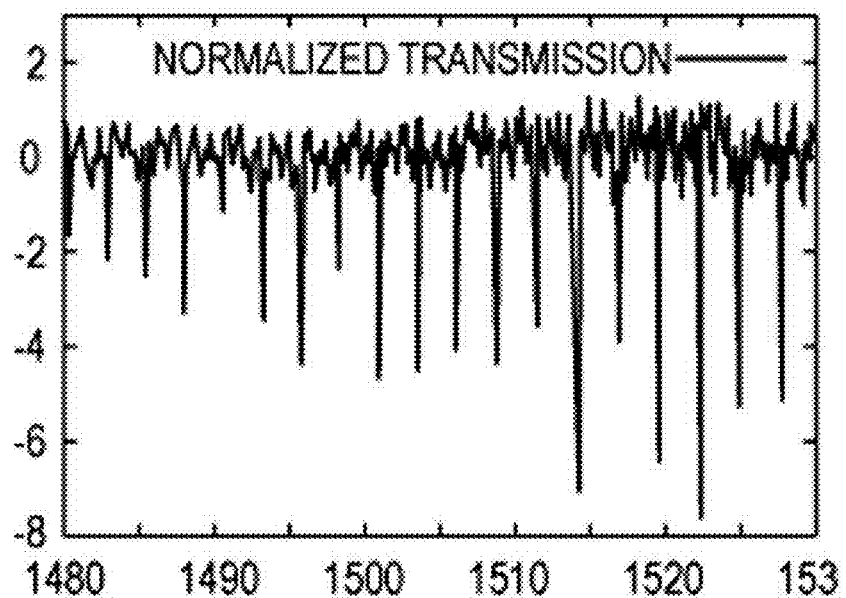
FIG. 5 is a diagram showing the measured transmission spectrum in dB vs. laser wavelength in nm past a high quality factor slot ring resonator.
Figure 6:
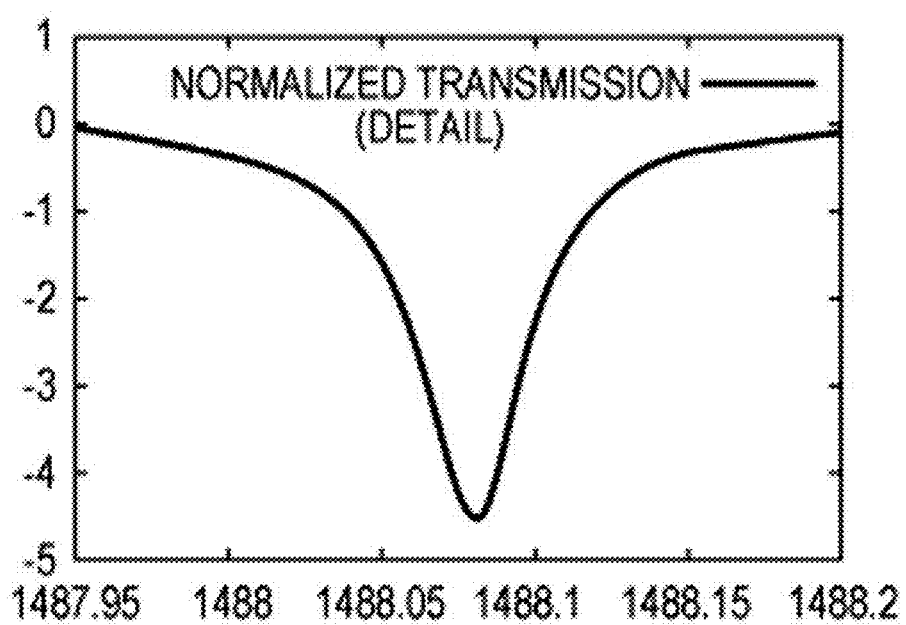
FIG. 6 is a diagram showing the detail of the peak of the transmission spectrum near 1488 nm.

We have observed a quality factor of 27,000 in a device fabricated with a slot size of 70 nm, a ring to input waveguide edge to edge separation of 650 nm, and a coupling distance of 1.6 µm. The radius of the circular part of the slotted oval was 50 µm. This resonance was observed near 1488 nm, and the resonance peak had an extinction ratio of 4.5 dB. FIG. 5 shows the measured transmission spectrum past the ring, normalized for the input coupler baseline efficiency of our test system. FIG. 6 shows the details of one peak in the vicinity of 1488 nm. Because the extinction ratio at the resonance peak was not very large in this case, it was not possible to accurately determine waveguide losses from this device. By measuring many devices with different geometries, we obtained data on resonators with higher extinction ratios that approached critical coupling. One such device was a 50 µm radius slotted ring resonator with a 60 nm waveguide gap, a ring to input waveguide spacing of 550 nm and coupling length of 1.6 µm. In this device, a Q of 23,400 was observed near 1523 nm, with an on-resonance extinction of 14.7 dB.

Since this resonance is nearly critically coupled, the waveguide loss can be estimated using equation (1) as −10 dB/cm. We can also use equation (2) to further validate our theoretical picture of the ring resonator. The observed free spectral range of this resonator was 2.74 nm, while equation (2) predicts 2.9 nm. This discrepancy is most likely due to small differences in the fabricated dimensions as compared to those for which the numerical solutions were obtained.

To further validate the waveguide loss result, several waveguide loss calibration loops were fabricated with varying lengths of the slot waveguide, ranging from 200 to 8200 um in length. A total of five center slot waveguide devices were studied for each of the 50, 60 and 70 nm slot widths. Linear regression analysis on the peak transmission of each series yielded waveguide loss figures of 11.6±3.5 dB/cm for the 50 nm center waveguide, 7.7±2.3 dB/cm for the 60 nm center waveguide, and 8.1±1.1 dB/cm for the 70 nm center waveguide. These figures are in agreement with the loss estimated from the oval resonator. Since the theoretical loss due to substrate leakage is much lower than this, it is clear that a great deal of loss is due to surface roughness and possibly material absorption. It is believed that engineering improvements will decrease this loss further. For sensing and modulation applications as well as use in nonlinear optics, the high optical field concentration that can be supported in the cladding material of the slotted waveguide geometry should be very advantageous when compared to more conventional waveguides.

Figure 7:
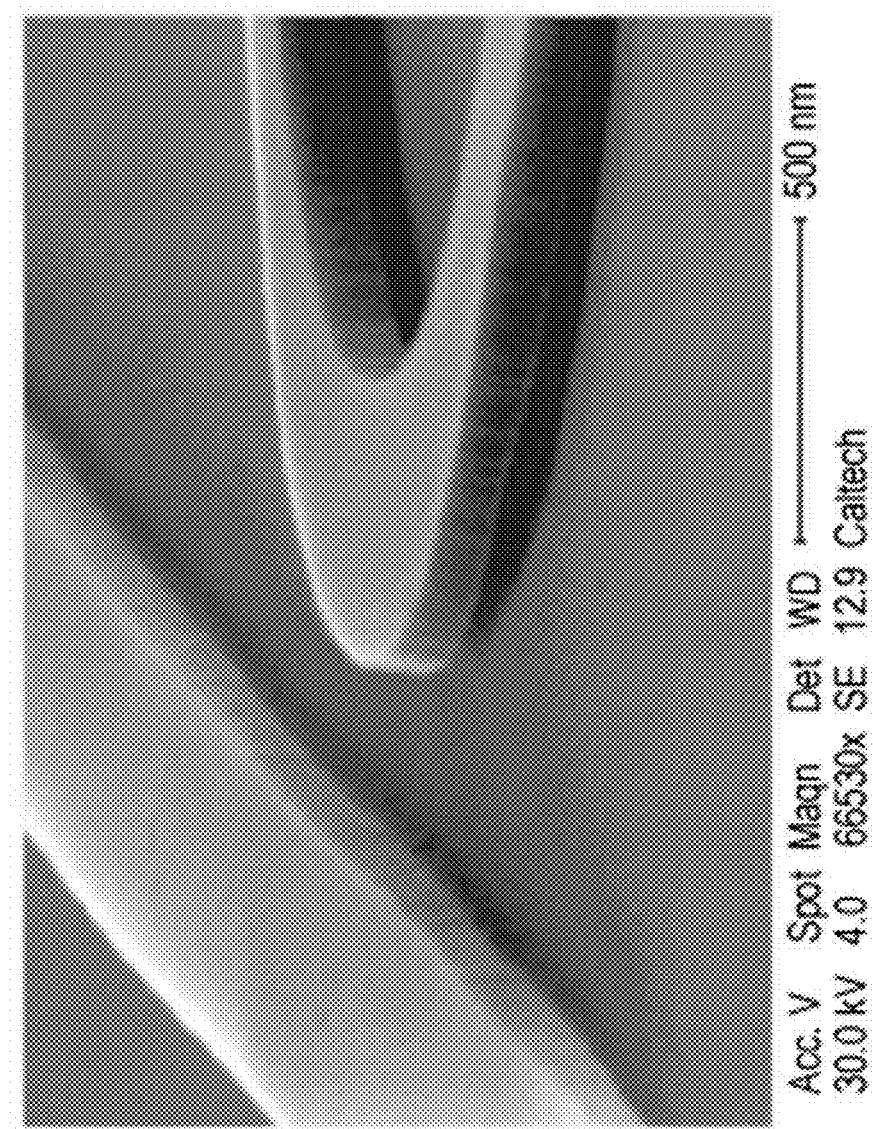
FIG. 7 is a diagram showing a shallow angle SEM view of a typical silicon-on-insulator ring resonator and waveguide having a sidewall roughness on the order of 10 nm.
Figure 8:
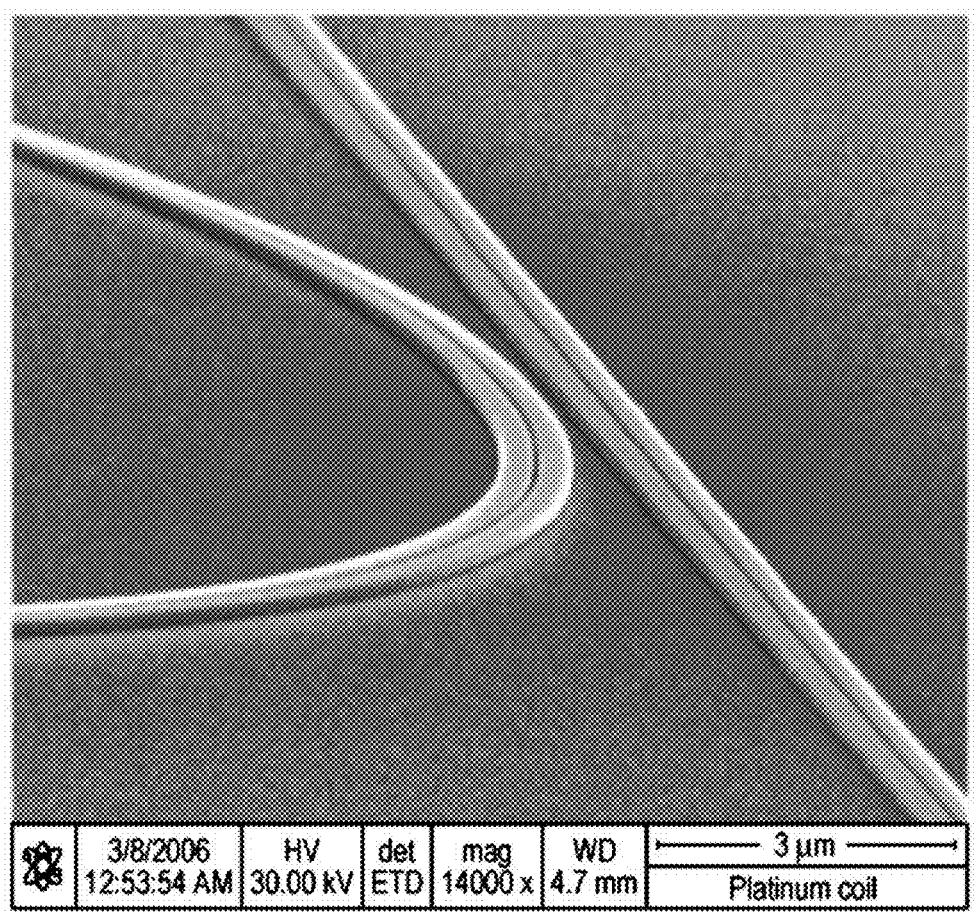
FIG. 8 is a diagram of a slot ring resonator directional coupler region, and the associated input waveguide.

FIG. 7 is a diagram showing a shallow angle SEM view of a silicon-on-insulator ring resonator and waveguide having a sidewall roughness on the order of 10 nm. In the exemplary waveguide shown in FIG. 7, the silicon-insulator bond has been decorated with a brief buffered oxide etch. FIG. 8 is a diagram of a slot ring resonator directional coupler region, and the associated input waveguide.

Figure 9:
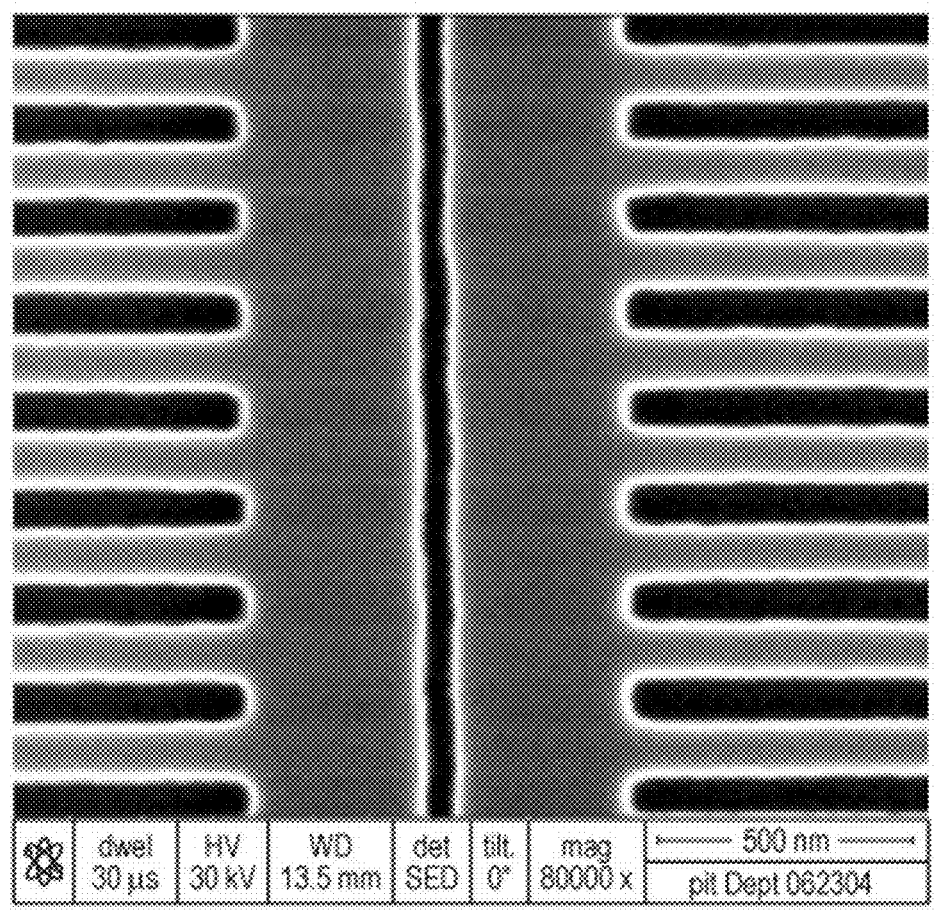
FIG. 9 is a diagram showing an exemplary high-index segmented waveguide structures, which in the embodiment shown comprises a central waveguide portion with fingers or ridges sticking out to the sides.

Other variations on the geometry of waveguides are possible. FIG. 9 is a diagram showing an exemplary high-index segmented waveguide structures, which in the embodiment shown comprises a central waveguide portion with fingers or ridges sticking out to the sides. With the light localized in the center in a Bloch mode, electrical contact can be established using the fingers or ridges that stick off the sides of the waveguide. This structure provides a way to form both electrical contacts to waveguides and structures that would provide electrical isolation with low optical loss. Through an iterative process involving a combination of optical design using a Hermetian Bloch mode eigensolver and fabrication of actual structures, it was found that (non-slotted) segmented waveguide structures could be constructed in 120 nm thick SOI. Waveguide losses as small as −16 dB per centimeter were observed, and insertion losses as small as −0.16 dB were shown from standard silicon waveguides.

Figure 10A:
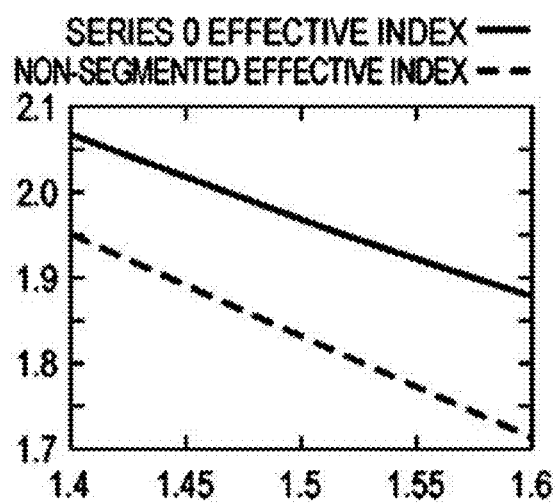
FIG. 10A is a diagram that shows a dispersion diagram of both a segmented waveguide and the normal, unsegmented waveguide, taken on a plane parallel to the substrate that on a z plane that intersects the middle of a segment.
Figure 10B:
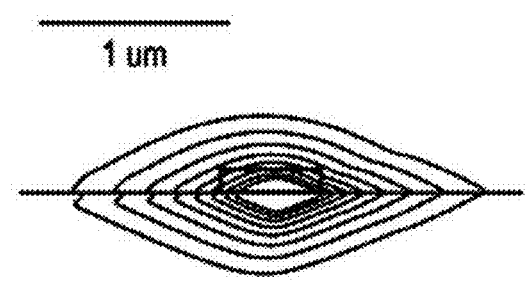
FIG. 10B is a diagram that shows modal patterns of the Bloch mode, with contours of |E| plotted, starting at 10% of the max value and with contour increments of 10%.
Figure 10C:
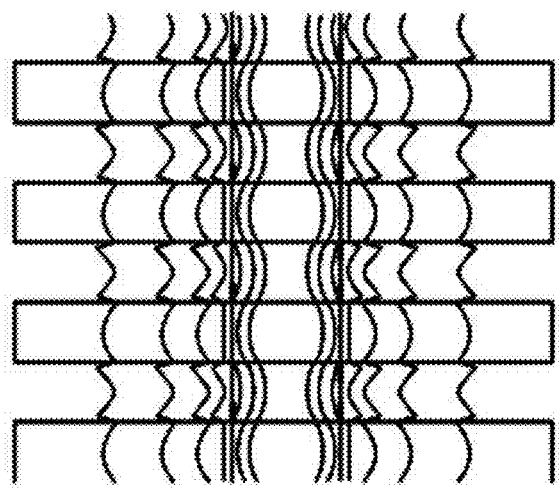

The segmented waveguide structure can also be modeled as regards its expected properties, which can then be compared to actual results. FIG. 10A is a diagram that shows a dispersion diagram of both a segmented waveguide and the normal, unsegmented waveguide, taken on a plane parallel to the substrate that on a z plane that intersects the middle of a segment. FIG. 10B is a diagram that shows modal patterns of the Bloch mode, with contours of |E| plotted, starting at 10% of the max value and with contour increments of 10%. FIG. 10C is a diagram that shows a plot of modal patterns over four periods of a segmented waveguide on a horizontal plane that intersects the silicon layer halfway through.

Figure 11:
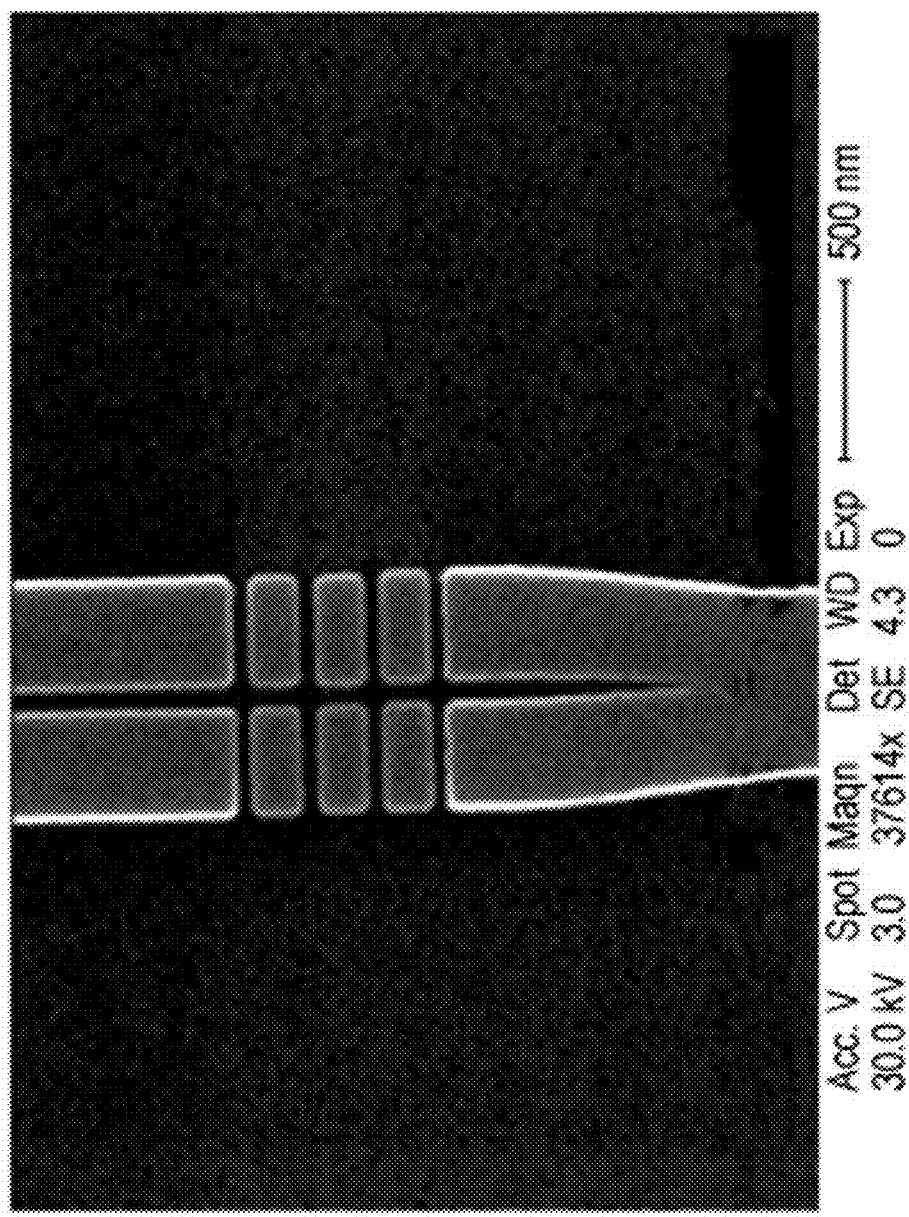
FIG. 11 is a diagram that shows an exemplary electrical isolator that was constructed and tested, and which provided both a transition from a standard to a slotted waveguide and electrical isolation between the two sides of the slot waveguide.

By utilizing the same type of design methodology as was used for the segmented waveguides, one is able to able to construct structures that provide electrical isolation without substantial optical loss. FIG. 11 is a diagram that shows an exemplary electrical isolator that was constructed and tested, and which provided both a transition from a standard to a slotted waveguide and electrical isolation between the two sides of the slot waveguide. Such structures were shown to have losses on the order of 0.5 dB.

Optical Modulation and Detection in Slotted Silicon Waveguides

In this example, we describe a system and process that provide low power optical detection and modulation in a slotted waveguide geometry filled with nonlinear electro-optic polymers and present examples that demonstrate such methods. The nanoscale confinement of the optical mode, combined with its close proximity to electrical contacts, enables the direct conversion of optical energy to electrical energy, without external bias, via optical rectification, and also enhances electro-optic modulation. We demonstrate this process for power levels in the sub-milliwatt regime, as compared to the kilowatt regime in which optical nonlinear effects are typically observed at short length scales. The results presented show that a new class of detectors based on nonlinear optics can be fabricated and operated.

Waveguide-based integrated optics in silicon provide systems and methods for concentrating and guiding light at the nanoscale. The high index contrast between silicon and common cladding materials enables extremely compact waveguides with very high mode field concentrations, and allows the use of established CMOS fabrication techniques to define photonic integrated circuits. By using slotted waveguides, it is possible to further concentrate a large fraction of the guided mode into a gap within the center of a silicon waveguide. This geometry greatly magnifies the electric field associated with the optical mode, resulting in electric fields of at least (or in excess of) $10^6$ V/m for continuous-wave, sub-milliwatt optical signals. Moreover, since the slotted geometry comprises two silicon strips which can be electrically isolated, a convenient mechanism for electro-optic interaction is provided. Such waveguides can be fabricated with low loss. We have previously described systems that provide losses below −10 dB/cm.

In the present example, we exploit both the high intensity of the optical field and the close proximity of the electrodes for several purposes. First, we demonstrate detection of optical signals via direct conversion to electrical energy by means of nonlinear optical rectification. An exemplary device comprises a ring resonator with an electro-optic polymer based $\chi^2$ material deposited as a cladding. Inside the slot, the high optical field intensity creates a standing DC field, which creates a virtual voltage source between the two silicon electrodes, resulting in a measurable current flow, in the absence of any external electrical bias. Though optical rectification has been observed in electro-optic polymers, typically instantaneous optical powers on the order of 1 kW are needed for observable conversion efficiencies, often achieved with pulsed lasers. The exemplary embodiment provides measurable conversion with less than 1 mW of non-pulsed input, obtained from a standard, low power tunable laser operating near 1500 nm.

In one embodiment, systems and methods of the invention provide standard Pockels' effect based modulation, which is similarly enhanced by means of the very small scale of our device. The close proximity of the electrodes, and ready overlap with the optical mode, causes an external voltage to produce a far larger effective electric modulation field, and therefore refractive index shift, than would be obtained through conventional waveguide designs. In one embodiment, the modulation and refractive index shift is provided by tuning the resonance frequencies of a slot waveguide ring resonator.

Device Fabrication

Waveguide Fabrication

The devices described in this example were fabricated in electronic grade silicon-on-insulator (SOI) with a top layer thickness of 110 nm and an oxide thickness of 1.3 microns. The silicon layer is subsequently doped to approximately $10^{19}$ Phosphorous atoms/cm$^3$, yielding resistivities after dopant activation of about 0.025 ohm-cm. Electro-optic ("EO") polymers were then spin-deposited onto the waveguide structures and subsequently poled by using a high field applied across the slot in the waveguide.

Lithography was performed using a Leica EBPG 5000+ electron beam system at 100 kv. Prior to lithography, the samples were manually cleaved, cleaned in acetone and isopropanol, baked for 20 minutes at 180 C, coated with 2 percent HSQ resist from Dow Corning Corporation, spun for two minutes at 1000 rpm, and baked for an additional 20 minutes. The samples were exposed at 5 nm step size, at 3500 $\mu C/cm^2$. The samples were developed in AZ 300 TMAH developer for 3 minutes, and etched on an Oxford Instruments PLC Plasmalab 100 with chlorine at 80 sccm, forward power at 50 W, ICP power at 800 W, 12 mTorr pressure, and 33 seconds of etch time. The samples were then implanted with phosphorous at normal incidence, 3 OkeV energy, and $1 \times 10^{14}$ ions/cm$^2$ density. The sample was annealed under a vacuum at 950 C in a Jipilec Jetstar rapid thermal annealer. The samples were dipped in buffered hydrofluoric acid in order to remove the remnants of electron beam resist from the surface.

After initial optical testing, the samples were coated with YLD 124 electro-optic polymer, and in one case with dendrimer-based electro-optic material. The samples were stored under a vacuum at all times when they were not being tested, in order to reduce the chances of any degradation.

Measurement Results

Optical Rectification Based Detection

Figure 12:
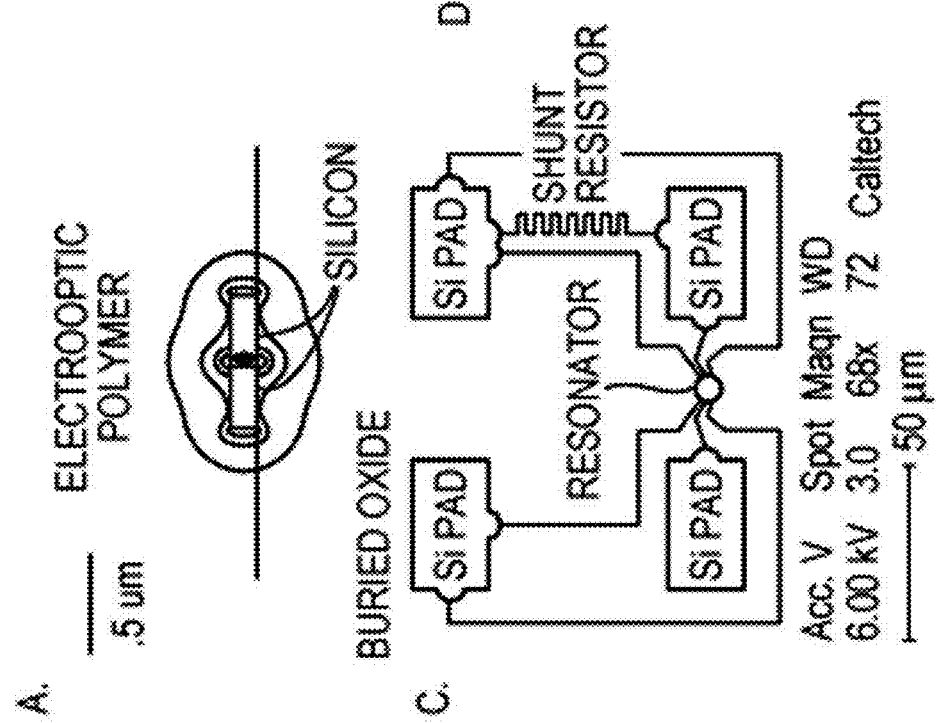
FIG. 12 is a four panel diagram that shows details of one embodiment of an optical modulator device, including the geometry of the photodetectors and filters, and including a cross section of the slotted waveguide.

FIG. 12 is a four panel diagram that shows details of one embodiment of an optical modulator device, including the geometry of the photodetectors and filters, and including a cross section of the slotted waveguide. Panel A of FIG. 12 shows a cross section of the device geometry with optical mode superimposed on a waveguide. In FIG. 12A, the optical mode was solved using a finite-difference based Hermetian Eigensolver, such as that described by A. Taflove, *Computational Electrodynamics*, (Artech House, Boston. Mass., 1995), and has an effective index of approximately 1.85 at 1500 nm. Most of the electric field is parallel to the plane of the chip, and it is possible to contact both sides of the slot in a slotted ring resonator, as shown in FIG. 12B, which shows a SEM image of the resonator electrical contacts. Electrically isolated contacts between the silicon rails defining the slotted waveguide introduce only about 0.1 dB of optical loss. FIG. 12C shows the logical layout of device, superimposed on a SEM image of a device. FIG. 12C details the layout of a complete slotted ring resonator, with two contact pads connected to the outer half of the ring, and two pads electrically connected to the inner half of the ring. A shunt resistor provides a means of confirming electrical contact, and typical pad-to-pad and pad-to-ring resistances range from 1 MΩ to 5 MΩ. FIG. 12D displays a typical electrically contacted slotted ring as presently described. FIG. 12D is an image of the ring and the electrical contact structures.

Measurements were performed with single-mode polarization maintaining input and output fibers, grating coupled to slotted waveguides with an insertion loss of approximately 8 dB. Optical signal was provided from an Agilent 81680a tunable laser and in some cases an erbium doped fiber amplifier ("EDFA") from Keopsys Corporation. A continuous optical signal inserted into a poled polymer ring results in a measurable current established between the two pads, which are electrically connected through a pico-Ammeter. In the most sensitive device, a DC current of ~1.3 nA was observed, indicating an electrical output power of ~$10^{-9}$ of the optical input power ($5 \times 10^{-12}$ W of output for approximately 0.5 mW coupled into the chip). Control devices, in which PMMA or un-poled EO material was substituted, show no photocurrent.

The fact that there is no external bias (or indeed any energy source) other than the optical signal applied to the system of this embodiment demonstrates conclusively that power is being converted from the optical signal. To establish that the conversion mechanism is actually optical rectification, we performed a number of additional measurements. A steady bias was applied to the chip for several minutes, as shown in Table 1A. A substantial change in the photoresponse of the device was observed. This change depends on the polarity of the bias voltage, consistent with the expected influence of repoling of the device in-place at room temperature. Specifically, if the external bias was applied opposing the original poling direction, conversion efficiency generally decreased, while an external bias in the direction of the original poling field increased conversion efficiency.

TABLE I

Polling Results

Part A:

| Action | New Steady State Current (6 dBm input) |
|---|---|
| Initial State | −5.7 pA |
| +10 V for 2 minutes | 0 pA |
| −10 V for 2 minutes | −7.1 pA |
| +10 V for 2 minutes | −4.4 pA |
| +10 V for 4 minutes | −6.1 pA |
| −10 V for 4 minutes | −4.5 pA |
| −10 V for 2 minutes | −14.8 pA |

Part B:

| Device | Action | Current Polarity of Optical Rectification |
|---|---|---|
| 1 | Positive Poling | Positive |
| 1 | Thermal Cycling to poling temperature with no_voltage | Rapid fluctuation, did not settle |
| 1 | Negative Poling | Negative |
| 2 | Negative Poling | Negative |
| 2 | Thermal Cycling to Poling temperature with no voltage | None observable |
| 2 | Positive Poling | Negative |
| 3 | Negative Poling | Negative |
| 4 | Positive Poling | Positive |
| 5 | Negative Poling | Negative |

To further understand the photo-conversion mechanism, 5 EO detection devices were poled with both positive and negative polarities, thus reversing the direction of the relative $\chi^2$ tensors. For these materials, the direction of $\chi^2$ is known to align with the polling E field direction, and we have verified this through Pockels' effect measurements. In all but one case, we observe that the polarity of the generated potential is the same as that used in poling, and the +V terminal during poling acts as the −V terminal in spontaneous current generation, as shown in Table 1B. Furthermore, the polarity of the current is consistent with a virtual voltage source induced through optical rectification. It was observed that these devices decay significantly over the course of testing, and that in one case the polarity of the output current was even observed to spontaneously switch after extensive testing. However, the initial behavior of the devices after poling seems largely correlated to the $\chi^2$ direction.

Part A of Table I shows the dependence of the steady state observed current after room temperature biasing with various voltage polarities for one device. The device was originally polled with a ~12 V bias, though at 110 C. With one exception, applying a voltage in the direction of the original polling voltage enhances current conversion efficiencies, while applying a voltage against the direction of the polling voltage reduces the current conversion efficiencies. It should be noted that the power coupled on-chip in these measurements was less than 1 mW due to coupler loss.

Part B of Table I shows the behavior of several different devices immediately after thermal polling or cycling without voltage. Measurements were taken sequentially from top to bottom for a given device. The only anomaly is the third measurement on device 2; this was after significant testing, and the current observed was substantially less than was observed in previous tests on the same device. We suspect that the polymer was degraded by repeated testing in this case.

Analysis of Data for Optical Rectification

To derive the magnitude of the expected photocurrent, we assume that the $\chi^2$ magnitude relating to the Pockels' effect is similar to that for optical rectification. A measurement of $\chi^2$ can then be obtained from the direct observation of the electro-optic coefficient by the standard measurements described earlier. The typical measured tuning value of 2 GHz/V yields approximately 50 pm/V.

In the best case, devices with 6 dBm of input power returned approximately 1.4 nA of current. With Qs ranging from 3 k to 5 k, and assuming approximately 7 dB of insertion loss in the input grating coupler on one of our chips, in the best case as much as 0 dBm might be circulating in a resonator on resonance. This implies a peak electric field due to the optical signal of approximately $3.1 \times 10^6$ V/m. The induced static nonlinear polarization field is then nearly 1000 V/m, which amounts to a voltage drop of $14 \times 10^{-5}$ V across a 140 nm gap. If this voltage is assumed to be perfectly maintained, and the load resistance is assumed to be 5 Mn, then 28 pA would be generated, about a factor of 100 less than is observed in the largest measurement made, but within a factor of 20 of the typical measurement of 352 pA for 6 dBm of input. Significantly, because the generated current is quadratic in E, it is clear that the current will be linearly proportional to the input intensity. This is in accordance with our observations. The best results for optical rectification were obtained with YLD 124/APC polymer, whereas our best Pockels' Effect results were obtained with the dendrimer materials.

Significantly, the sign of the output current matches that which would be predicted by nonlinear optical rectification, as discussed above. Specifically, since positive current emanates from the positive terminal, the rectified E field has a sign reversed from the $\chi^2$ and the polling E field. It is well established that the $\chi^2$ direction tends to align with the direction of the polling E field. Because of this, the rectified field acting as a voltage source will produce an effective positive terminal at the terminal that had the positive polling voltage.

We do not yet fully understand the current generation mechanism. In particular, it is not clear what provides the mechanism for charge transport across the gap. The APC material in which the nonlinear polymer is hosted is insulating, and though it does exhibit the photoconductivity effect due to visible light, it is unclear whether it can for near-infrared radiation. Photoconductivity due to second harmonic generation may play a role in this effect. It is certainly the case, however, that current flows through this gap; that is the only region in the entire system where an electromotive force exists. Also, photoconductivity alone is not adequate to explain the reversal of the current coming from the detector devices when the poling direction is reversed, nor the conversion of the optical input into directed current in general. The only mechanism to our knowledge that adequately explains this data is optical rectification.

If we assume that it will be possible to achieve a 10-fold improvement in the Q's of the resonators, while still getting more than 10 dB of extinction, then the intensity circulating in such a ring would be about 13 dB up from the intensity of the input wave. By comparison, with a Q of about 1000 and high extinction, the peak circulating intensity is about the same as the intensity in the input waveguide. Therefore, it is reasonable to expect that it will be possible to get at least 10 dB of improvement in the circulating intensity, and thus in the conversion efficiency, by fabricating higher Q rings.

By combining the nano-scale slotted waveguide geometry with electro-optical polymers having high nonlinear constants, we have obtained massive enhancement of the optical field. That has in turn enabled us to exploit nonlinear optical processes that are typically only available in the kW regime in the sub-mW regime. This difference is so considerable that we believe it represents a change in kind for the function of nonlinear optical devices. In addition, it is believed that this hybrid material system provides systems and methods for creating compact devices that exploit other nonlinear phenomena on-chip.

Optical rectification based detectors can have many advantages over currently available technology. In particular, such detectors are expected to function at a higher intrinsic rate than the typical photodiode in use, as the optical rectification process occurs at the optical frequency itself, on the order of 100 THz in WDM systems. The absence of an external bias, and the generation of a voltage rather than a change in current flow, both provide certain advantages in electronic operation. We also believe that a device based on nonlinear optical rectification will not suffer from the limitation of a dark current. This in turn can provide WDM systems that will function with lower optical power, providing numerous benefits. Similarly, our demonstration of enhanced modulation using these waveguide geometries provides useful components for future communications systems.

We believe that there will be advantageous economic aspects of such devices in various embodiments. Because our devices can be fabricated in planar electronics grade silicon-on-insulator, using processes compatible with advanced CMOS processing, it is expected that devices embodying these principles will be less expensive to fabricate.

Optical Modulators

Optical modulators are a fundamental component of optical data transmission systems. They are used to convert electrical voltage into amplitude modulation of an optical carrier frequency, and they can serve as the gateway from the electrical to the optical domain. High-bandwidth optical signals can be transmitted through optical fibers with low loss and low latency. All practical high-speed modulators that are in use today require input voltage shifts on the order of 1V to obtain full extinction. However it is extremely advantageous in terms of noise performance for modulators to operate at lower drive voltages. Many sensors and antennas generate only millivolts or less. As a result it is often necessary to include an amplifier in conventional optical transmission systems, which often limits system performance. By using silicon nano-slot waveguide designs and optical polymers, it is possible today to construct millivolt-scale, broadband modulators. In some embodiments, a millivolt-scale signal is one having a magnitude in the range of hundreds of millivolts down to units of millivolts. Using novel nanostructured waveguide designs, we have demonstrated a 100× improvement in Vπ over conventional electro-optic polymer modulators.

Figure 13:
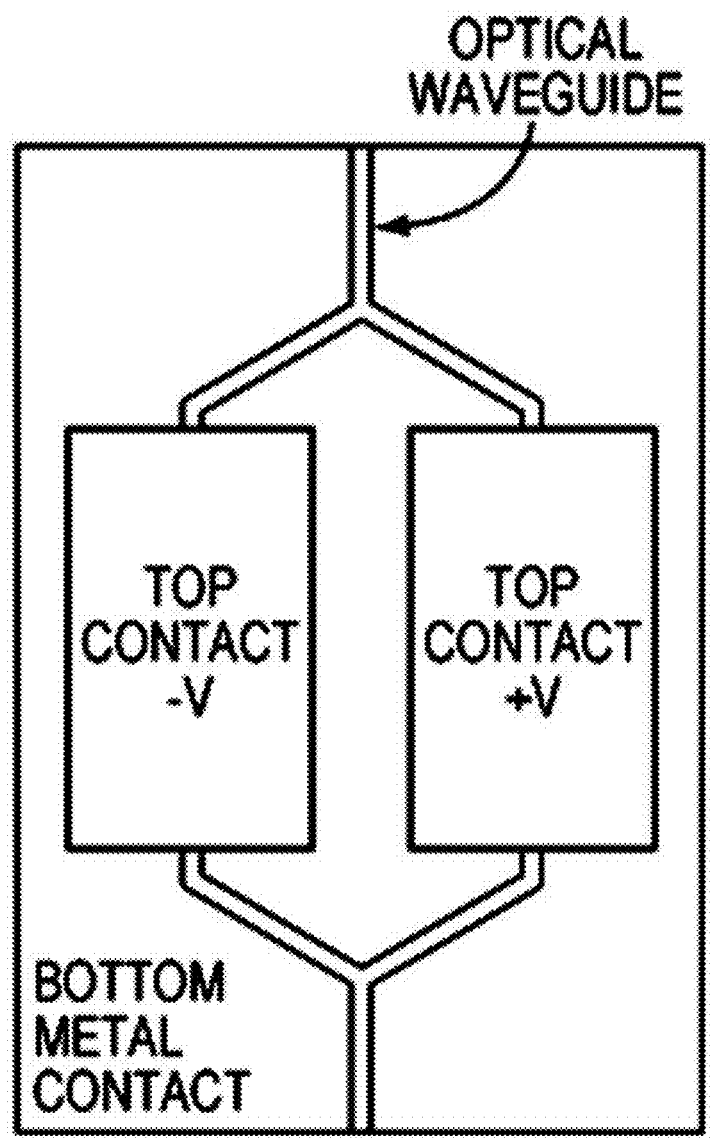
FIG. 13 shows a diagram of a Mach-Zehnder modulator with a conventional electrode geometry in top-down view, including top contact, waveguide, and bottom contact layers.

A variety of physical effects are available to produce optical modulation, including the acousto-optic effect, the Pockels effect either in hard materials, such as lithium niobate or in electro-optic polymers, free-carrier or plasma effects, electro-absorption, and thermal modulation. For many types of optical modulation, the basic design of a modulator is similar; a region of waveguide on one arm of a Mach-Zehnder interferometer is made to include an active optical material that changes index in response to an external signal. This might be, for instance, a waveguide of lithium niobate, or a semiconductor waveguide in silicon. In both cases, a voltage is introduced to the waveguide region by means of external electrodes. This causes the active region to shift in index slightly, causing a phase delay on the light traveling down one arm of the modulator. When the light in that arm is recombined with light that traveled down a reference arm, the phase difference between the two signals causes the combined signal to change in amplitude, with this change depending on the amount of phase delay induced on the phase modulation arm. Other schemes, where both arms are modulated in order to improve performance, are also common The measure of the strength of a modulation effect is how much phase shift is obtained for a given input voltage. Typical conventional modulators obtain effective index shifts on the order of 0.004% for 1 V. This implies that a Mach-Zehnder 1 cm in length, meant to modulate radiation near 1550 nm, would require 1 V of external input for the arms to accumulate a relative phase shift of $\pi$ radians. The half wave voltage $V_\pi$ (or $V_{pi}$) is the voltage needed for an interarm phase shift of $\pi$ radians (or 180 degrees). Lower values for $V_7$ imply that less power is needed to operate the modulator. Often, the responsivity, a length-independent product $V_\pi$-L is reported. Typical $V_\pi$-L values are in the range of 8 Vcm in silicon, or 6 V-cm for lithium niobate modulators. This voltage-length product, or responsivity, is an important figure of merit for examining a novel modulator design. Making a modulator physically longer generally trades lower halfwave voltage against reduced operating frequency and higher loss. Because generating high-speed and high-power signals requires specialized amplifiers, particularly if broadband performance is required, lowering the operating voltage of modulators is extremely desirable, particularly for on-chip integrated electronic/photonic applications, (including chip-to-chip interconnects) where on-chip voltages are limited to levels available in CMOS. FIG. 13 shows a diagram of a Mach-Zehnder modulator with a conventional electrode geometry.

FIG. 13 is a top-down view of a simple conventional Mach-Zehnder polymer interferometer, showing top contact, waveguide, and bottom contact layers. Such a device is usually operated in 'push/pull' mode, where either opposite voltages are applied to the different arms, or where the two arms are poled in opposite directions to achieve the same effect.

In the past several years, silicon has gained attention as an ideal optical material for integrated optics, in particular at telecommunications wavelengths. Low loss optical devices have been built, and modulation obtained through free carrier effects. One of the waveguides that can be supported by silicon is the so-called slot waveguide geometry. This involves two ridges of silicon placed close to each other, with a small gap between them. We have demonstrated modulation regions based on filling this gap with a nonlinear material, and using the two waveguide halves as electrodes. In such a geometry, the silicon is doped to a level that allows electrical conductivity without causing substantial optical losses. This allows the two wires or ridges to serve both as transparent electrical contacts and as an optical waveguide.

Using slot waveguides, we previously obtained an improvement in modulation strength of nearly 5× when compared to the best contemporary conventional waveguide geometries with electrodes separated from the waveguide, with the initial, non-optimized designs. This improvement was based on the remarkably small width of the gap across which the driving voltage drops. It is expected that smaller gaps translate into higher field per Volt, and the Pockels Effect depends on the local strength of the electric field. The smaller the gap, the larger the index shift. A unique property of slot waveguides is that, even as these gaps become nanoscale, the divergence conditions on the electric field require that much of the optical mode remains within the central gap. As a result, changing the index within a nanoscale gap can give a remarkably large change in the waveguide effective index. Because of these divergence conditions, the optical mode's effective index is largely determined by the shift found even in very small gaps.

Low $V_\pi$ Modulators

Several major approaches toward achieving low $V_\pi$ modulation have recently been pursued. The free-carrier dispersion effect in silicon waveguides has been used. Green et al. achieved a $V_\pi$ of 1.8 V with this effect. Modulators based on lithium niobate are also frequently used. Typical commercially obtained $V_\pi$ values are 4 V. Recently, Mathine and co-workers have demonstrated a nonlinear polymer based modulator with a $V_\pi$ of 0.65 V. For the devices produced by others, the attained values of $V_\pi$ are large.

A number of approaches have been proposed for developing low $V_\pi$ modulators. Different proposed approaches rely the development of new electrooptic materials, or on optical designs that trade bandwidth for sensitivity, either through the use of resonant enhancement, or through dispersion engineering. The designs presented herein are based upon conventional, high-bandwidth Mach-Zehnder traveling wave approaches, but achieve appreciable benefits from using nano-slot waveguides. Of course, these designs can also take advantage of the newest and best electrooptic polymers. In principle, any material that can be coated conformally onto the surface of the silicon waveguides and that is reasonably resistive could be used to provide modulation in these systems, making the system extremely general.

The most recent nonlinear polymers achieve a high nonlinear coefficient, expressed as an $r_{33}$ of 500 pm/V. Using this in combination with the high susceptibilities described above, it is believed that it is possible today to construct a 1 cm Mach-Zehnder modulator with a $V_\pi$, of 8 mV. This corresponds to a ring resonator with a tuning sensitivity of 795 GHz/V. Both of these values are two orders of magnitude better than the performance obtained by current approaches. Current commercially available modulators typically have $V\pi$'s from 1 to 9 V, and current tunable electro-optic polymer based resonators achieve 1 GHz/V of tunability. If the $r_\pi$ value of 33 pm/V demonstrated by Tazawa and Steier for conventional polymer designs is used, then a $V_\pi$ of 64 mV and a resonator tunability of 50 GHz/V are obtained.

Segmented waveguide contact structures can be formed that allow very low resistance electrical contact to slot waveguides. We have described above, in similar circumstances, electrical contact to waveguides can be established via segmented waveguides. See FIG. 12B and FIG. 12D and the discussion related thereto. When the RC circuits implied by the segmentation geometry and the gap are examined, it is found that RC turn on times on the order of 200 GHz or more are achievable. Because the nonlinear polymers exhibit an ultrafast nonlinearity, these waveguide geometries present a path to making Terahertz scale optical modulators. Because the modulation is so strong, it is also possible to trade the length of the modulator against $V_\pi$. For example, our optimal geometry is expected obtain a $V\pi$ of 0.6 V with a 100 μm long Mach-Zehnder modulator. This device is expected be exceptionally simple to design for 10 GHz operation, as it could likely be treated as a lumped element. We have shown above that lateral contact structures with low loss and low resistance can be constructed with these slot waveguides. See FIG. 12B and FIG. 12D and the discussion related thereto.

We believe these nano-slot waveguide designs present a path to realizing very high speed, low voltage modulators. It is advantageous to be able to attain a responsivity $V_\pi$-L of less than 1 V-cm. The physical principles involved in such devices are based on employing a nonlinear material of at least moderate resistivity, and a high index contrast waveguide with tight lithographic tolerances. Therefore, it is expected that nano-slot waveguides, either as Mach-Zehnder or ring-based devices, are likely an advantageous geometry for optical modulation with nonlinear materials in many situations. In addition, materials compatibility and processing issues are greatly reduced for such devices compared to conventional multilayer patterned polymer modulator structures.

These high index contrast devices have (or are expected to have) extremely small bend radii, which are often orders of magnitude smaller than corresponding all-polymer designs with low loss and high Q. These geometric features translate into extremely high free spectral ranges for ring modulators, compact devices, and wide process latitudes for their fabrication. Given the inexpensive and readily available foundry SOI and silicon processes available today, and the commercial availability of electron beam lithography at sub-10 nm line resolution, it is expected that slot-waveguide based modulators are likely to replace conventional modulators in many applications in the coming years.

Waveguide Geometries

Figure 14:
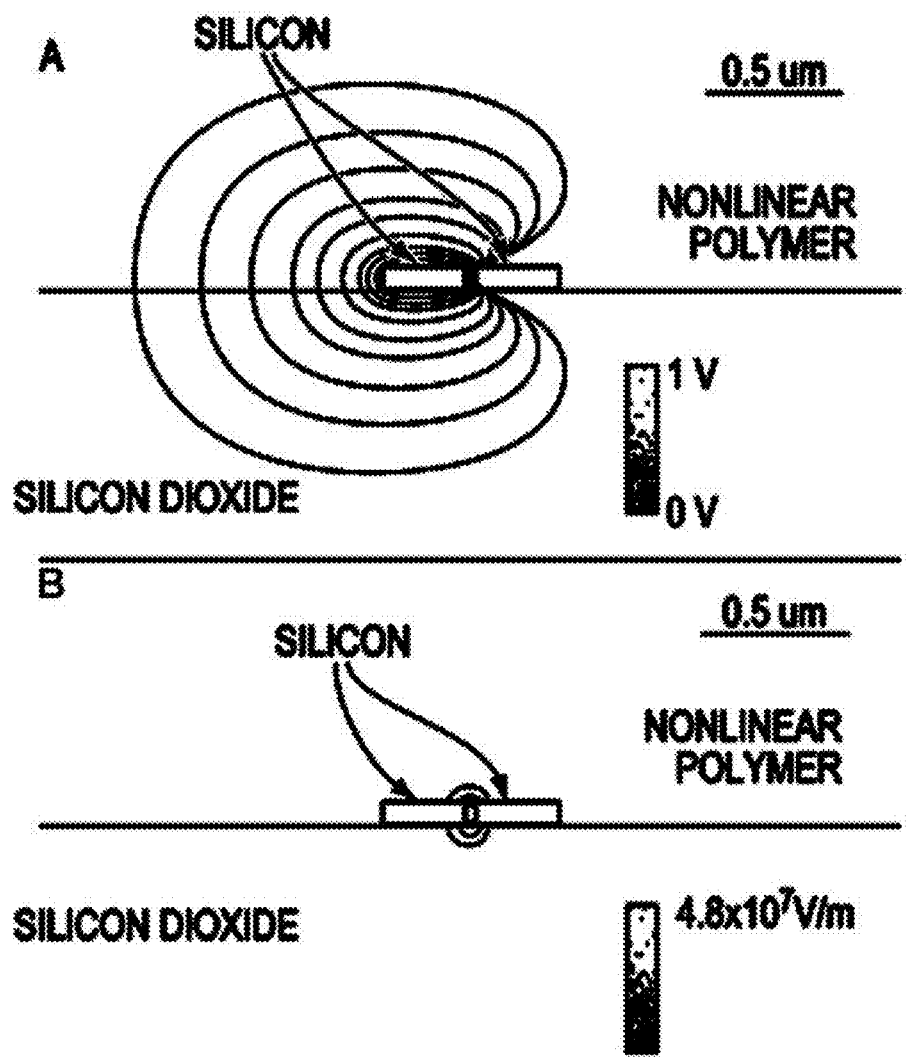
FIG. 14A shows the static voltage potential field distribution due to charging the two electrodes.
FIG. 14B shows the electric field due to the potential distribution. |E| is plotted in increments of 10%.

We now describe several different waveguide geometries, and show the effective index susceptibility as a function of the slot sizes of the waveguide. The susceptibilities are calculated near a 1550 nm free space wavelength. However, the values obtained will not vary much from 1480 nm to 1600 nm as the modal pattern does not change significantly. In the embodiments described, the waveguides are composed of silicon, and assumed to rest on a layer of silicon dioxide. The top cladding is a nonlinear polymer with an index of 1.7. This is similar to the waveguide geometry that we have used in our modulation work described hereinabove. FIG. 14 shows the static electric fields solved as part of analyzing waveguide design 1 with a gap of 40 nm, as described in Table 2. As one would expect, the field is nearly entirely concentrated inside the slot area. The field shown was calculated assuming a voltage difference of 1 Volt. It is slightly larger than simply the reciprocal of the gap size due to the singular nature of the solution to Poisson's equation near the corners of the waveguide.

FIGS. 14A and 14B illustrate solved field patterns for the analysis of waveguide 1 at a 40 nm gap. FIG. 14A shows the static voltage potential field distribution due to charging the two electrodes. FIG. 14B shows the electric field due to the potential distribution. |E| is plotted in increments of 10%.

We have constrained ourselves to use waveguide geometries that have minimum feature sizes of at least 20 nm. These are near the minimum feature sizes that can be reliably fabricated using e-beam lithography. Table 2 lists a description of each type of waveguide studied. Each waveguide was studied for a number of different gap sizes. In all cases, the maximum susceptibility was obtained at the minimum gap size. The maximum gap size studied and the susceptibility at this point are also listed. In some cases, the study was terminated because at larger gap sizes, the mode is not supported; this is noted in Table 2. For multislot waveguide designs where there are N arms, there are N−1 gaps; the design presumes that alternating arms will be biased either at the input potential or ground.

Table 2 shows the effective index susceptibility for various waveguide designs. The susceptibility is approximately inversely proportional to gap size.

It is clear that within the regime of slotted waveguides, it is always advantageous to make the slot size smaller, at least down to the 20 nm gap we have studied. This causes the DC electric field to increase, while the optical mode tends to migrate into the slot region, preventing any falloff due to the optical mode failing to overlap the modulation region.

TABLE 2

| Waveguide Design | Waveguide Height (nm) | Arm Sizes (nm) | Maximum $\gamma$ ($\mu m^{-1}$) | Minimum $\gamma$ ($\mu m^{-1}$) |
|---|---|---|---|---|
| 1 | 100 | 300, 300 | 1.3, 20 nm gap | .40, 140 nm gap |
| 2 | 150 | 300, 300 | 1.6, 20 nm gap | .68, 120 nm gap |
| 3 | 200 | 300, 300 | 2.3, 20 nm gap | .74, 120 nm gap |
| 4 | 100 | 400, 400 | 1.1, 20 nm gap | .67, 60 nm gap, modal limit |
| 5 | 100 | 250, 250 | 1.2, 20 nm gap | .56, 60 nm gap, modal limit |
| 6 | 100 | 300, 40, 300 | 1.6, 20 nm gap | .53, 80 nm gap, modal limit |
| 7 | 100 | 300, 40, 40, 300 | 1.9, 20 nm gap | .76, 60 nm gap, modal limit |
| 8 | 200 | 200, 40, 200 | 3, 20 nm gap | 1.4, 60 nm gap, modal limit |
| 9 | 300 | 300, 300 | 2.5, 20 nm gap | 2.5, 20 nm gap, modal limit |
| Steier et al. | N/A | N/A | .026, 10 μm gap | N/A |

In examining the results of our calculations, it is useful to calculate the maximum susceptibilities that can be obtained. For an effective index of about 2, which is approximately correct for these waveguides, and a gap size of 20 nm, the maximum achievable $\gamma$ is approximately 12.5 mm$^{-1}$. Thus, for a gap size of 20 nm, waveguide design 8 is already within 25% of the theoretical maximum value.

It is also worth noting the corresponding $\gamma$ value that can be obtained by calculation using our methods for the separated electrode approach of Steier. The effective index of the mode is expected to be about 1.8, and the gap distance for the dc field is 10 um. Under the most optimistic assumptions about mode overlap with the active polymer region (that is, assuming complete overlap), this corresponds to a $\gamma$ of about 0.03 $\mu m^{-1}$.

It is useful to calculate, given the current $r_{33}$ values that are available, the index tuning that might be achieved with these designs. The most advanced polymers now yield $r_{33}$ values of 500 pm/V. If a bulk refractive index of 1.7 is used, then a $\partial n/\partial V$ of 0.006 V$^{-1}$ is obtained with the best design given above. Using a waveguide with an effective index of 2 and a group index of 3, which are typical of silicon-polymer nano-slot waveguides, the $V_\pi$, for a Mach-Zehnder with a length of 1 cm is expected to be about 6 mV. The resonance shift that is expected to be obtained in a ring resonator configuration would be 380 GHz per volt. Both of these values represent orders of magnitude improvement in the performance of these devices compared to current designs.

Segmented Contacting

As we have shown empirically, silicon can be doped to about 0.025 Ω-cm of resistivity with a n-type dopant without substantially increasing losses. Other dopants or perhaps other high index waveguiding materials may have even higher conductivities that can be induced, without significantly degrading optical performance. However, it is known that the conductivity cannot be increased endlessly without impacting optical loss.

This naturally presents a serious challenge for the issue of driving a slot waveguide of any substantial length. Consider a slot waveguide arm of length 1 mm, formed of our optimal design. The capacitor formed by the gap between the two electrodes is about 0.25 pF. The 'down the arm' resistance of the structure, however, is 4 MΩ. Therefore, the turn on time of an active waveguide based on this is about 0.1 μS, implying a 10 MHz bandwidth.

A solution to this problem is presented by continuously contacting the waveguide via a segmented waveguide. This comprises contacting the two silicon ridges with a series of silicon arms. Even though the silicon arms destroy the continuous symmetry of the waveguide, for the proper choice of periodicity no loss occurs, and the mode is minimally distorted. This is because a Bloch mode is formed on the discrete lattice periodicity, with no added theoretical loss. Of course the performance of fabricated devices will be different from that of conventional slot waveguides due to fabrication process differences. We have previously demonstrated empirically that continuous electrical contact can be formed for non-slotted waveguide via segmentation with relatively low optical losses.

Figure 15:
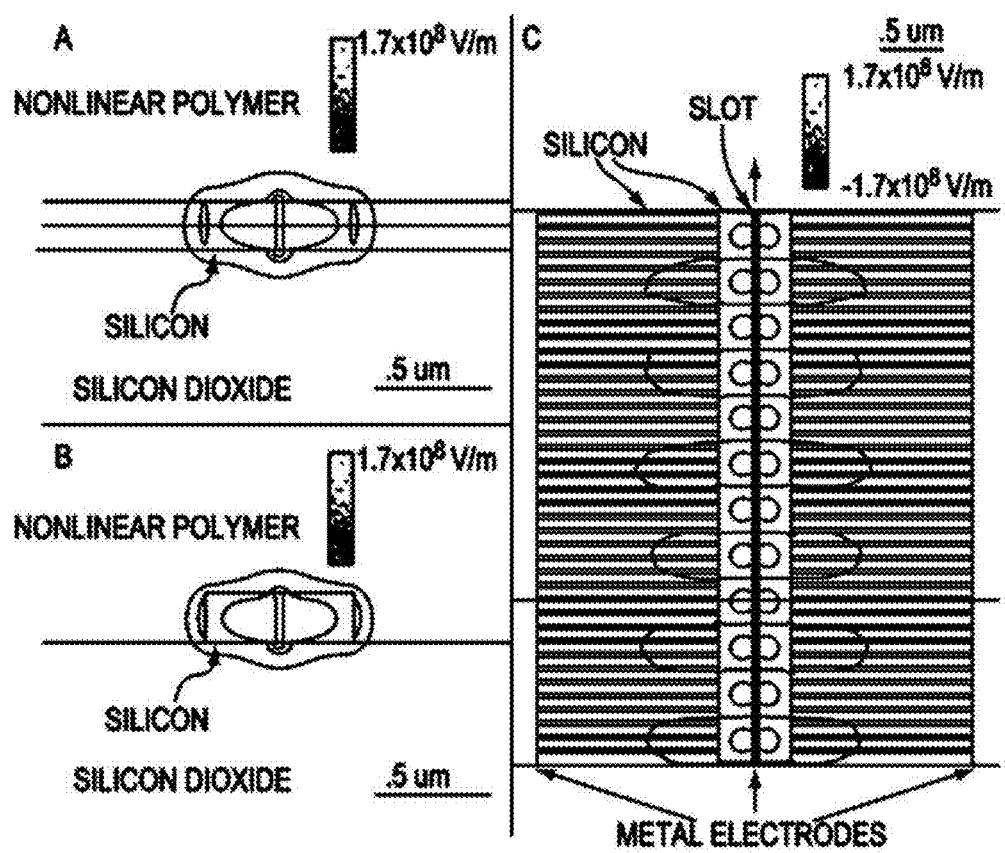
FIG. 15A shows a cross section of the segmented, slotted waveguide, with the |E| field plotted in increments of 10% of max value.
FIG. 15B shows a similar plot for the unsegmented waveguide.
FIG. 15C shows a horizontal cross section of the segmented, slotted waveguide in which Re(Ex) is plotted in increments of 20% of max.

Here we present a simulation of a particular segmentation geometry for our optimal slot waveguide design, that with 200 nm tall and 300 nm wide arms and a gap of 20 nm. We have found that a segmentation with 40 nm arms, and a periodicity of 100 nm, appears to induce no loss or significant mode distortion in the waveguide. Around 2 um of clearance appears to be needed from the edge of the segmented waveguide to the end of the arms. FIGS. 15A, 15B and 15C show plots of several cross sections of the segmented slot waveguide with a plot of the modal pattern overlaid. For comparison, a cross section of the unsegmented slot waveguide is presented as well. Simulations were also performed to confirm that the index shift formula continued to apply to the segmented slotted waveguide. It was found that the index shift was in approximate agreement with the value predicted for the non-segmented case. Non-segmented modesolvers were used for the rest of the simulations in this work, because simulation of the segmented designs is radically more computationally burdensome than solving for the unsegmented case, as they require solving for the modes of a 3d structure. Since the index shifts for the unsegmented and segmented cases are extremely similar, solving for the modes in the unsegmented cases is adequate for purposes of design and proof-of-concept.

FIG. 15A shows a cross section of the segmented, slotted waveguide, with the |E| field plotted in increments of 10% of max value. FIG. 15B shows a similar plot for the unsegmented waveguide. FIG. 15C shows a horizontal cross section of the segmented, slotted waveguide; Re(Ex) is plotted in increments of 20% of max. In an actual device, some sort of metal based transmission line would undoubtedly provide the driving voltage for the waveguide. The metal electrodes that would likely form part of this transmission line have been noted in FIG. 15C. In all cases the mode has been normalized to have 1 Watt of propagating power. FIG. 15A and FIG. 15C show the location of the other respective cross section as a line denoted C in FIG. 15A and A in FIG. 15C.

Assuming a 0.025 Ω-cm resistivity, one can calculate the outer arm resistance as 63 kΩ per side per period, while the inner arm resistance is 25 kΩ per side per period. The gap capacitance per period is $2.5 \times 10^{-17}$ Farads. This implies a bandwidth on the order of 200 GHz.

We now describe an electro-optic modulator fabricated from a silicon slot waveguide and clad in a nonlinear polymer. In this geometry, the electrodes form parts of the waveguide, and the modulator driving voltage drops across a 120 nm slot. As a result, a half wave voltage of 0.25 V is achieved near 1550 nm. This is one of the lowest values for any modulator obtained to date. As the nonlinear polymers are extremely resistive, our device also has the advantage of drawing almost no current. It is believed that this type of modulator could operate at exceedingly low power.

A unique advantage with nonlinear polymers is that an integrated optical circuit can be conformally coated by a nonlinear polymer. This property, when combined with a slot waveguide, enables the construction of a uniquely responsive modulator. We describe the use of a push-pull Mach-Zehnder modulator configuration in which each arm has an opposing bias, leading to an opposing phase shift.

Figure 16:
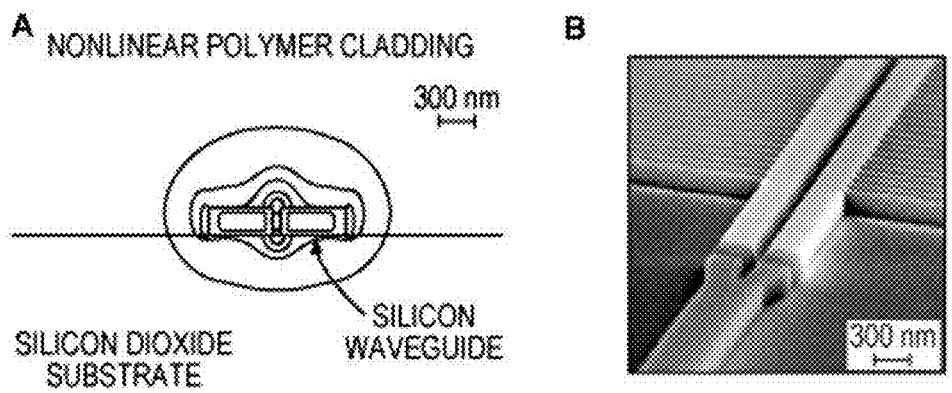
FIG. 16A is a diagram of the silicon slot waveguide used in the Mach-Zehnder modulator, according to principles of the invention.
FIG. 16B is an SEM micrograph of a slot waveguide, according to principles of the invention.

FIG. 16A shows the slot waveguide used for the Mach-Zehnder modulator. The modal pattern near 1550 nm is plotted, and contours of |E| are shown. FIG. 16B is an SEM micrograph of a slot waveguide. In this case, the slot waveguide is being coupled to with a ridge waveguide; this mode converter involves tiny gaps which ensure electrical isolation between the two arms. Contacting arms are also present around 3 μm from the ridge/slot junction. The dimensions are two 300×100 nm arms separated by a 120 nm slot.

Nonlinear polymers typically have very high resistivity of $10^{11}$ Ωcm. As a result, the two silicon arms are electrically isolated and can be used as modulator electrodes. The voltage drop between the arms occurs across a 120 nm electrode spacing, as opposed to the 5-10 μm that is typically required for modulators involving a nonlinear polymer and metallic contacts. This is a fundamental advantage that slot waveguide geometries have for electro-optic modulation.

It is advantageous to contact the silicon arms with an external electrode throughout the length of the Mach-Zehnder device to minimize parasitic resistances. We use a segmented waveguide in which a periodic set of small arms touches both waveguide arms. We use a segmentation with a periodicity of 0.3 nm and arm size of 0.1 nm that is largely transparent to the optical mode.

Figure 17:
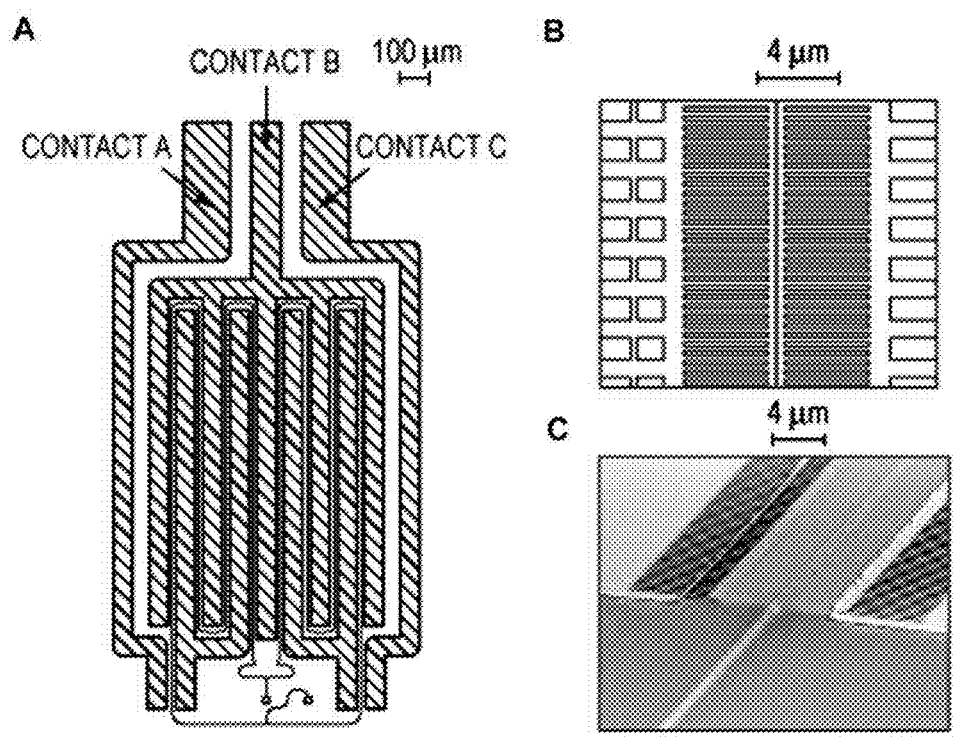
FIG. 17A is a diagram of the modulator layout, according to principles of the invention.
FIG. 17B and FIG. 17C are two SEM micrographs of modulators constructed according to principles of the invention, that show the slotted, segmented region, as well as the location where the silicon makes contact with the electrical layer.

Because the polymer has a second order nonlinearity, a Mach-Zehnder modulator can be operated in push-pull mode, even with no dc bias, effectively doubling the modulator response. FIG. 17A is a diagram of the modulator layout, in which contacts A, B, and C are shown. FIG. 17B is a diagram and FIG. 17C is a SEM micrograph that show the slotted, segmented region, as well as the location where the silicon makes contact with the electrical layer.

Referring to FIG. 17A, there are three regions in the modulator that are capable of maintaining distinct voltages. During poling operation, contact A is given a voltage of $2V_{pole}$, contact B a voltage of $V_{pole}$, and contact C is held at ground. To achieve a poling field of 150 V/μm, $V_{pole}$ was 18 V. This has the effect of symmetrically orienting the polymer in the two Mach-Zehnder arms. During device operation, contact B is driven at the desired voltage, while contacts A and C are both held at ground, leading to asymmetric electric fields in the two arms for a single bias voltage. This is the source of the asymmetric phase response. Electrical regions A and C cross the waveguide by means of a slotted ridged waveguide. At the ridge to slot mode converter, a small gap is left that maintains electrical isolation but is optically transparent. This enables the device to be built without requiring any via layers. A driving voltage from a DC voltage source was applied to contact B, while contacts A and C were held at ground.

Figure 18:
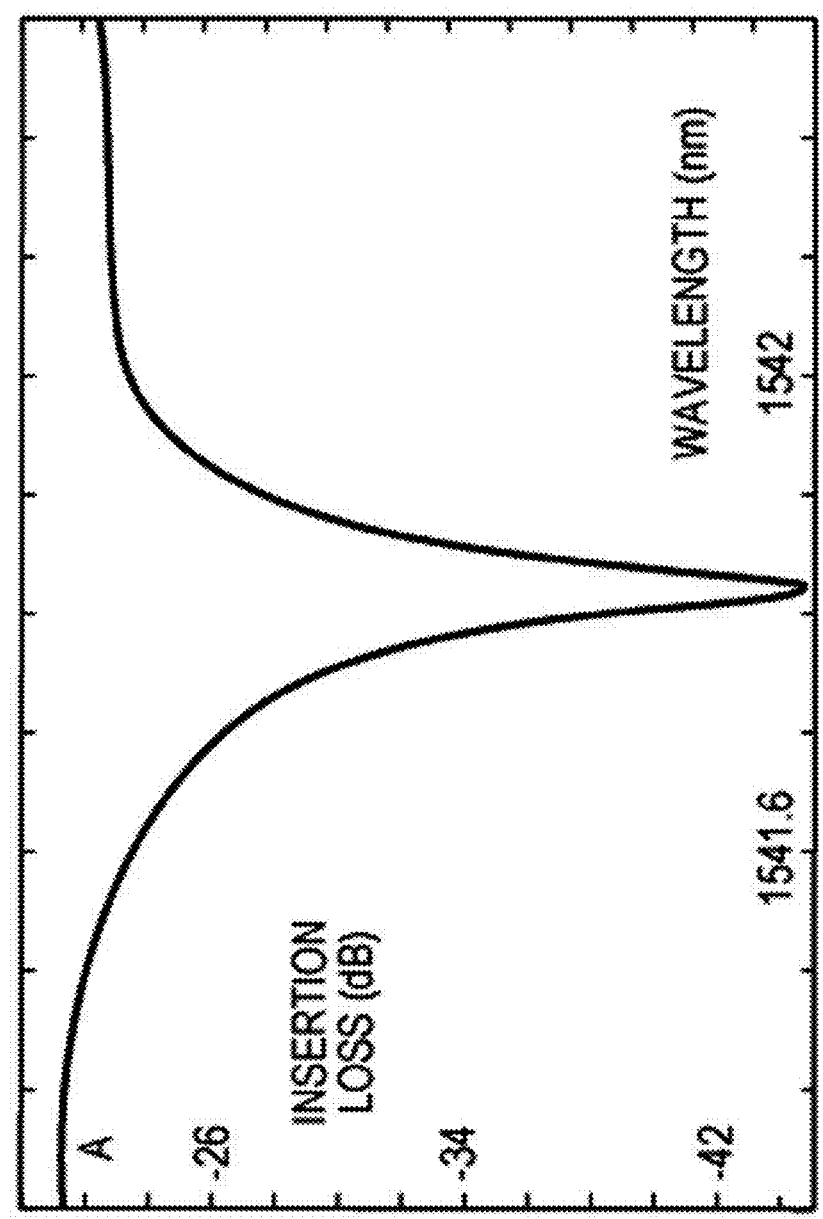
FIG. 18 is a diagram that shows a transmission spectrum of an electroded slot waveguide resonator with a gap of 70 nm. Fiber to fiber insertion loss is plotted in dB, against the test laser wavelength in nm.

We have recently demonstrated empirically that slot sizes of around 70 nm can be fabricated in 110 nm SOI as ring resonators with electrical contacts. FIG. 18 is a diagram that shows a transmission spectrum of an electroded slot waveguide resonator with a gap of 70 nm. Fiber to fiber insertion loss is plotted in dB, against the test laser wavelength in nm. We have also confirmed through electrical measurements that the two halves of the slots are largely electrically isolated.

We believe that there is the possibility of constructing even narrower slot waveguides, on the scale of 1-5 nm in thickness. For example, one could use epitaxial techniques to grow a horizontal slot structure (rather than the vertical structures we have explored thus far) with an active, insulating material, with silicon beneath and above. This could be done in a layer form analogous to SOI wafer technology, in which a very thin layer of electroactive material such as the polymers we have described herein could be introduced. Such structures offer the possibility of yet another order of magnitude of improvement in the low-voltage performance of modulators. We anticipate our slot structures to be fairly robust even in the presence of fabrication errors. Fabrication imperfections may cause some of the narrower slots to have tiny amounts of residual silicon or oxide in their centers, or to even be partially fused in places. As long as electrical isolation is obtained, and the optical loss is acceptable, we would expect the slot performance to decrease only in a linear proportion to the amount of the slot volume that is no longer available to the nonlinear polymer cladding.

The description provided herein may be augmented by the descriptions provided in the following patents and pending patent applications: U.S. Pat. Nos. 7,200,308, 7,424,192, U.S. Patent Application Publication No. 2009/0022445A1, U.S. patent application Ser. Nos. 12/110,153, 12/167,063, 12/251,032, and 12/454,950, PCT/US2009/33516, and PCT/US2009/36128, each of which patents and applications is incorporated herein by reference in its entirety.

Graphene has very interesting properties such as ultra high mobility allowing for light detectors with transit time bandwidth limitations in excess of a THz, as well as very high absorption for a single atomic layer, since approximately 2.3% of the light can be absorbed by a single transmission through the graphene layer, over a wide wavelength range.

This absorption is still very small compared to what is required for a practical photodetector. It is not possible to increase the absorption by stacking more than a few graphene layers, since the material than looses the other properties of graphene, such as high mobility. However the interaction distance between graphene and light can be increased in a waveguide configuration, where graphene is located in close proximity to a waveguide, such as for example on top, on the bottom, or on the sides of a waveguide. In this case light propagates in the in-plane direction of the graphene film so that it interacts over a long distance with the material, allowing for a large fraction of the light to be absorbed. The graphene film can be physically separated from the waveguide as long as the evanescent field of the waveguide remains sufficiently strong in the location of the graphene film. He graphene film can also be inside the waveguide, for example if it is deposited or grown on the first half of the waveguide and the rest of the waveguide added on top at a later stage. Graphene is also a good candidate to place into the slot of a slot waveguide, since slot waveguides have very high field intensities in narrow slots and graphene is a thin, atomically thick layer.

The combination of graphene and waveguides with high non-linearities, for example if the graphene is engineered to have a bandgap for example by making nanoribbons or by applying an electrical field to multi-layer graphene. This bandgap can induce high non-linearities, for example if it is in the vicinity of the photon energy, or in the vicinity of twice the photon energy. These nonlinearities can also be enhanced with slot waveguides.

Exfoliated graphene films have been shown to conserve their properties when placed on silicon dioxide. For this reason, a possible configuration is to use doped silicon dioxide waveguides and to place graphene on top, or to place graphene on top and on the edges of etched dielectric or semiconductor waveguides. For example silicon nitride waveguides or silicon waveguides are also good candidates.

Graphene films are also obtained by heating up silicon carbide to high temperatures, typically larger than 1100 degree C. in a controlled environment (for example vacuum). A waveguide can be formed in silicon carbide material and subsequently heated up to form a graphene layer on the waveguide. If the waveguide losses in the silicon carbide waveguide are high, the waveguide can be coupled to different types of waveguides, for example dielectric waveguides, to route the light from the chip edge, grating couplers or other types of waveguide couplers to the photodetector.

A slot waveguide could be achieved by taking a waveguide with graphene on top, as described in the previous section, and depositing a low refractive index material on top, followed by a higher index material. The graphene film is than placed in a vertically stacked slot structure. For example (from bottom to top), SiC-Graphene-SiO2 (slot thickness)-Poly-Si or SiN, or for example SiN—SiO2 (thin)-Graphene-SiO2 (thin)-SiN. The first example is compatible with SiC sublimation based graphene growth as well as exfoliated graphene films, while the second one is compatible with exfoliated graphene films.

Since graphene photodetectors have a very high transit time, there is a big incentive to reduce their capacitance, since the photodetector bandwidth will be limited by the RC time constant of the system. This can be achieved by using a graphene film with a reduced size. This however also leads to a reduced responsivity. The responsivity can be recovered by placing the graphene photodetector inside an optical resonator. For example a waveguide photodetector can be placed within a ring.

Non-linear graphene based waveguides can also be placed into an optical resonator to enhance the effect of the non-linearity.

In all of the described inventions, carriers can be collected by various methods. For example the field created inside the graphene at the graphene to electrode contact can be used to sweep out the carriers. A pn junction can also be formed inside the graphene, for example by using a local gate to apply a local field bias, to create a field to sweep out the carriers.

In all of the above, the graphene film may be nanostructured, for example in the form of nanoribbons.

We describe the fabrication of various graphene nanomembrane devices. Scalable device fabrication is necessary for commercializing graphene-based optoelectronics and photonics. This requires large scale graphene synthesis. It is expected that one can use CVD (chemical vapor deposition) methods to grow graphene on copper foils. In principle, the size of graphene will be limited by the size of the furnace. It is expected that once can grow inch-scale graphene membranes.

It is expected that one can transfer as-grown graphene from copper foil to other substrates for device fabrication. This offers tremendous freedom to fabricate graphene-based optoelectronic devices. One can use any of the following strategies: (i) for graphene-silicon waveguide device fabrication, it is expected that one can first pre-pattern the graphene to various width and length and then transfer to the Si-waveguides. (ii) For suspended graphene interface junction optoelectronic devices, it is expected that one can pre-pattern graphene first and then transfer twice to form graphene interface junction. After defining Au electrodes by EBL systems, one can use buffer-oxide etching process to suspend graphene membrane. (iii) For graphene nanoribbon devices, it is expected that one can transfer graphene to $SiO_2$/Si substrate. One can then use EBL to define gold nanoribbon on top of graphene as an etching mask. After oxygen plasma etching, one can etch away Au to achieve arrays of graphene nanoribbon for various applications.

In order to characterize the optoelectronic response of suspended graphene devices at visible wavelengths, one can perform SPM to investigate the optoelectronic properties of the device. The laser will be focused on the device by a microscope objective with a diffraction limited spot (sub micron). The pre-patterned electrodes will collect photocurrent (PC). The laser scans across the device by a piezoelectric controlled mirror to generate a 2 dimensional PC image. Simultaneously, the reflected laser beam can be collected by a photodiode, which yields a device image. By comparing both images, one can spatially resolve the optoelectronic response. One can explore the parameter space such as continuous wave laser excitation, pulse excitation, and laser power dependence. This optical characterization is a useful step towards broadband, low heat dissipation and high-speed graphene optoelectronics.

One can characterize the performance of the hybrid graphene-waveguide systems. Based on proof-of-concept waveguide loss measurements with various graphene widths, one can estimate the realistic performance of graphene-Si hybrid slot and ridge waveguides for optical modulators and nonlinear frequency converters.

Figure 19A:
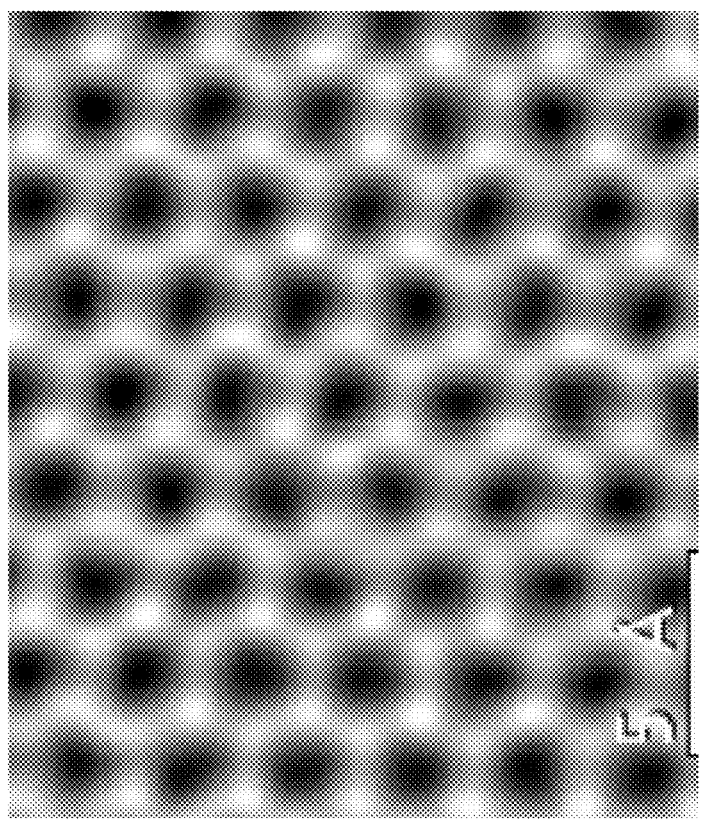
FIG. 19A is an atomic resolution transmission electron microscopy (TEM) image of single-layer graphene.
Figure 19B:
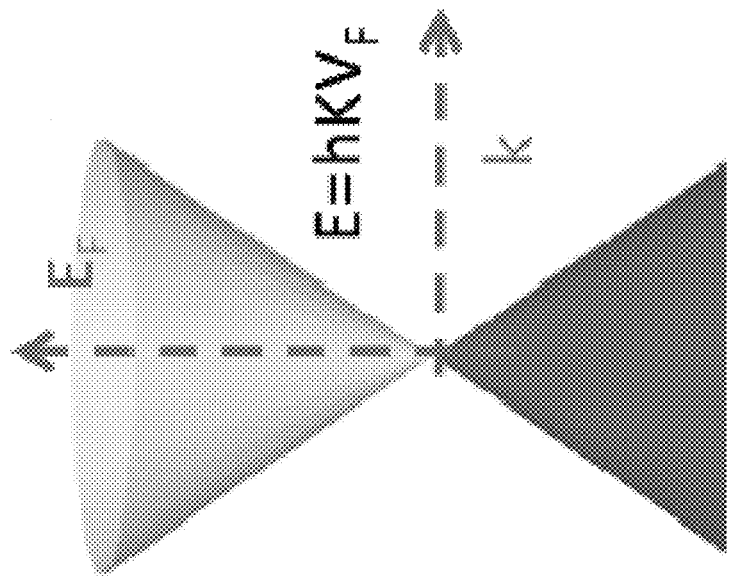
FIG. 19B is a Dirac cone electronic structure of graphene with linear energy-momentum dispersion.

Graphene is a two-dimensional atomic membrane formed by carbon atoms in a hexagonal structure, shown in FIG. 19A. As used herein, the term "graphene" is intended to include single atomic layer graphene, dual atomic layer graphene, multiple atomic layer graphene, and combinations thereof, including regions where a transition from a layer having M atomic layers to a region having N atomic layers occurs, M and N being positive integers. Graphene possesses a unique two-dimensional electronic system. Unlike other 2D electron gas systems obeying Schrödinger equations, the electrons in monolayer graphene behave as massless Dirac Fermions with an effective speed of light of $10^6$ m/s, which are described by Dirac equations (and are illustrated in FIG. 19B). This unique electronic property leads to many fascinating physical phenomena such as Klein tunneling and anomalous quantum Hall effects. The electron mobility also reaches $\sim 2 \times 10^5$ $cm^2$/V sec at room temperature. This ultrahigh electron mobility leads to the observations of fractional quantum Hall effects and indicates the possibility of basing high speed electronics on the use of this atomic sheet.

Graphene not only has extraordinary electronic properties, but also the electronic properties are tunable. By simply applying an electrical field, the Fermi level as well as the conductivity can be tuned in-situ. Gapless graphene can be engineered to be a tunable bandgap semiconductor by shaping graphene into nanometer width ribbons, or by patterning the graphene into nanomesh structures. In addition, conductive graphene can be engineered to be insulating by chemical functionalization with hydrogen or fluorine. Remarkably, this process is reversible. These tunable features make graphene an excellent system for carving all carbon-based electronics from this atomic single-layer carbon membrane.

The optical properties of graphene are equally fascinating. A single layer graphene is visible (see FIG. 19C) with an optical microscope due to the optical interference effect. The unique linear Dirac cone electronic structure enables graphene to universally absorb a remarkable 2.3% of light from the visible to infrared range, which ranks it as one of the materials with the strongest interband transition. This strong and universal light absorption indicates graphene is an excellent candidate for broadband photonic applications.

It is very rare for a material to have both attractive electronic and optical properties. Furthermore, graphene is extremely mechanically stiff with a Young's modulus of ~1 T Pa and sustain up to ~20% strain without breaking. It also has record thermal conductivity of ~5000 W/K·m at room temperature. The unification of all these amazing electrical, optical, mechanical, and thermal properties in this one-atom-thin membrane makes graphene an excellent system for high speed, energy efficient, foldable, and broadband optoelectronic, optomechanical, plasmonic and photovoltaic devices.

Graphene Synthesis

Figure 19C:
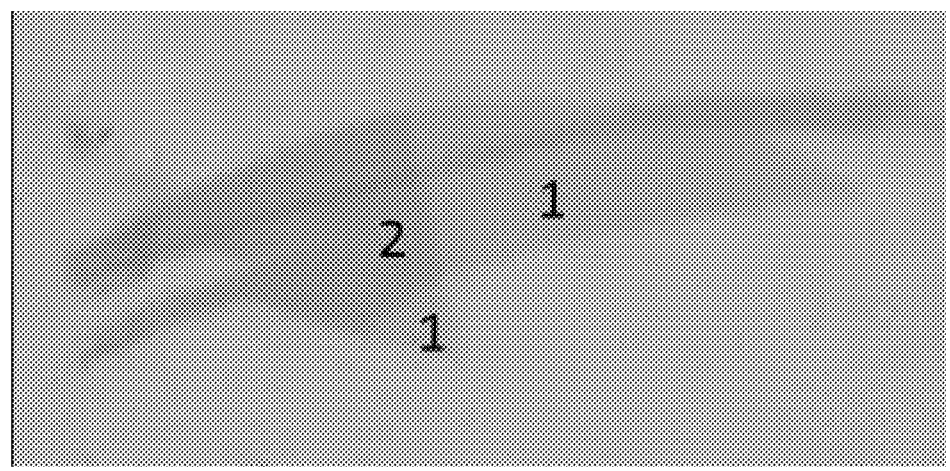
FIG. 19C is a microscope image of mechanical exfoliation graphene on a 90 nm $SiO_2$ on Si substrate. The numbers 1 and 2 in the figure denote monolayer graphene and bilayer graphene, respectively.

Graphene synthesis is developing at an extremely fast pace. Monolayer graphene was first successfully isolated at 2004 by the 'scotch tape method'. FIG. 19C is a microscope image of mechanical-exfoliated graphene on a 90 nm $SiO_2$/Si substrate. The advantage of mechanically-exfoliated graphene is that it is extremely clean and has outstanding physical properties. Thus it is used for much fundamental material research. However, this method is not scalable—the obtained graphene has a small size (sub ~100 um scale) and the yields are extremely low. It usually takes a graduate student a few hours searching under a microscope to get one reasonably graphene layer having a reasonable area. This 'Scotch tape method' is not suitable for scientific research, which requires exploring large parameter spaces such as device sizes and shapes. More importantly, for potential commercialized device applications, we must find a way to synthesize graphene in large scale.

Figure 20:
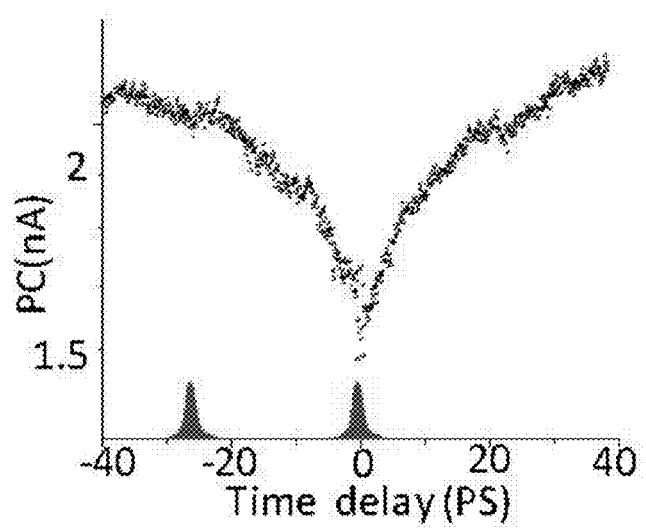
FIG. 20 is a graph showing a two-pulse pump-probe measurement of photocurrent dynamics of a graphene photodetector.

FIG. 20 is a graph showing a two-pulse pump-probe measurement of photocurrent dynamics of a graphene photodetector.

Figure 21:
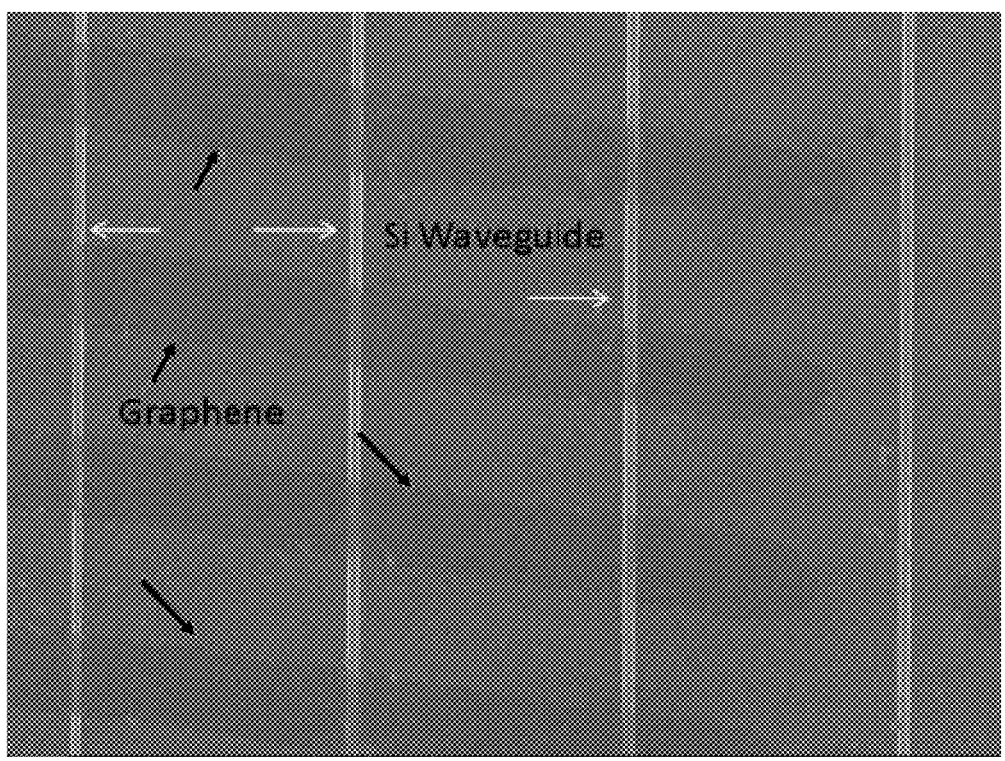
FIG. 21 is a scanning electron microscope (SEM) image of first generation hybrid graphene-silicon slot waveguide devices. The silicon waveguides are indicated with white arrows and the graphene layers are indicated with black arrows.

FIG. 21 is a scanning electron microscope (SEM) image of first generation hybrid graphene-silicon slot waveguide devices. The silicon waveguides are indicated with white arrows and the graphene layers are indicated with black arrows.

Graphene as a Nonlinear Cladding Material

Silicon is an excellent low-loss material for waveguide applications but has moderate nonlinear optical properties, generally limited by free carrier and two-photon effects. Thus, it is extremely desirable to integrate silicon-waveguides with strong nonlinear materials for new nonlinear optical devices. Recently, it has been reported that graphene atomic membrane has a strong $X^3$ of $10^{-7}$ at near infrared wavelength—almost three orders of magnitude stronger than any other material to our knowledge. Given the nature of the relevant nonlinear effects, this translates into, in some instances, multiple order-of-magnitude improvements in possible device figures of merit. The integration of graphene with silicon photonics may open the door for revolutionary nano-photonic technologies.

We expect to exploit this graphene-waveguide system as a broadband nonlinear frequency mixer and photodetector. FIG. 21 is a SEM image of our first generation of graphene-Si slot waveguide devices. We expect that one can fabricate waveguide-coupled photodetectors that can operate from NIR to MIR wavelengths with bandwidths over 100 GHz.

Graphene can also emit luminescence either by joule heating or pulse excitation. The luminescence has been interpreted from blackbody radiation and represents the temperature of hot electrons, which is estimated to go to 2000 K. It is expected that one can use our recently demonstrated middle-infrared waveguides to collect this hot carrier emission for developing innovative light emitters at middle-infrared regime. Furthermore, with the very high ultrafast all-optical nonlinearity of graphene, it is expected that one can build frequency converters and all-optical modulators that use graphene as the source of nonlinearity in silicon waveguides. It is expected that applications of graphene-based devices include broadband nonlinear frequency converters, optical modulators, thermal sensors, and infrared light emitters.

Figures 22A, 22B, 22C:
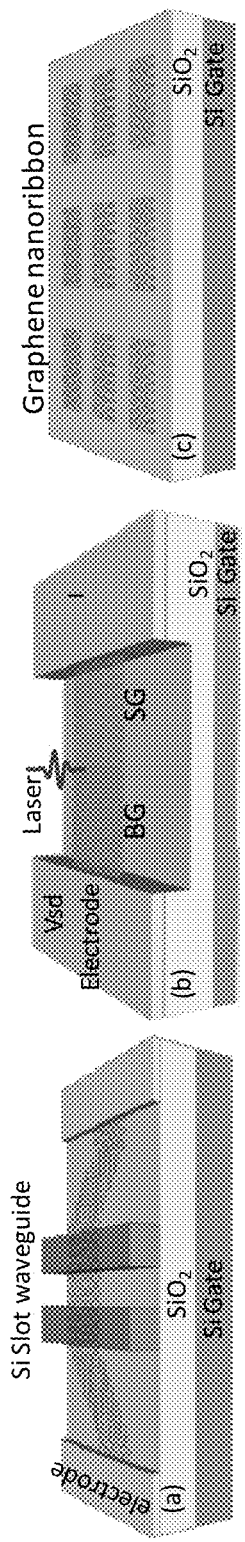
FIG. 22A is a schematic diagram of an integrated graphene-silicon slot waveguide optoelectronic device.
FIG. 22B is a schematic diagram of a suspended graphene interface junction optoelectronic device.
FIG. 22C is a schematic diagram of arrays of graphene nanoribbon devices on $SiO_2$/Si substrate.

FIG. 22A is a schematic diagram of an integrated graphene-silicon slot waveguide optoelectronic device.

FIG. 22B is a schematic diagram of a suspended graphene interface junction optoelectronic device.

FIG. 22C is a schematic diagram of arrays of graphene nanoribbon devices on $SiO_2$/Si substrate.

Figure 23:
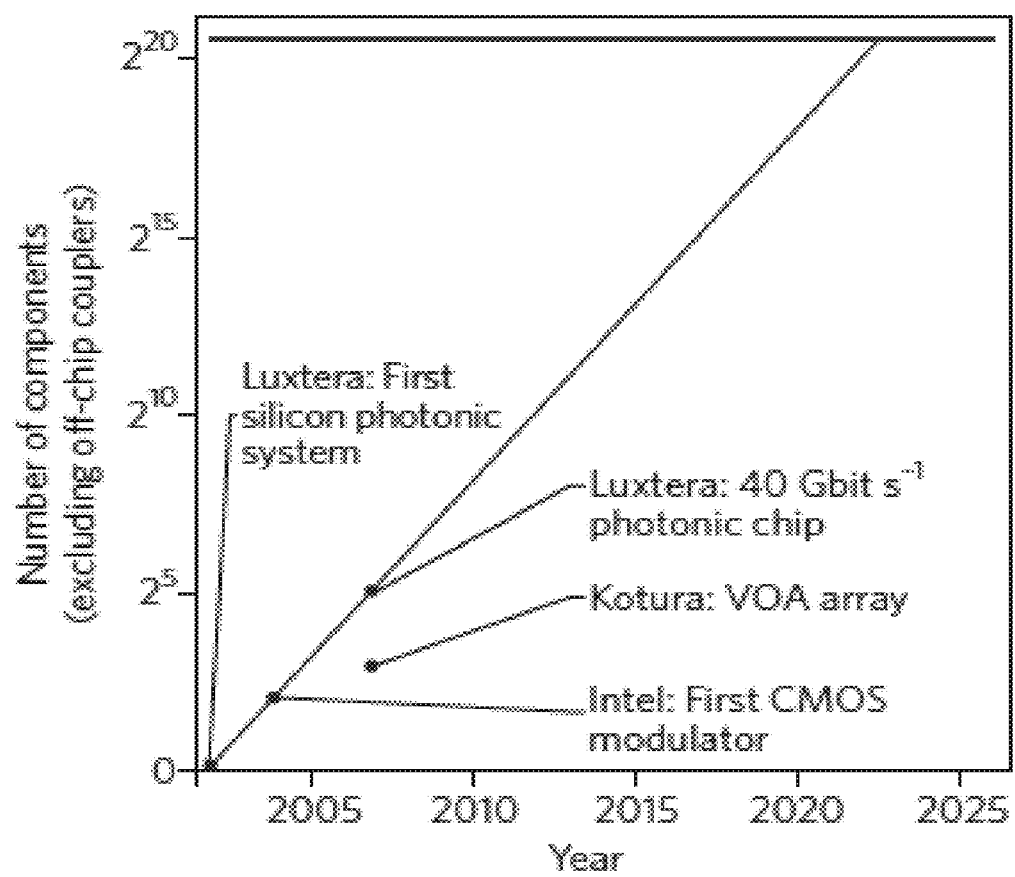
FIG. 23 is a graph that illustrates that silicon photonic systems are doubling in complexity at a rate significantly exceeding Moore's Law.

FIG. 23 is a graph that illustrates that silicon photonic systems are doubling in complexity at a rate significantly exceeding Moore's Law.

FIG. 24A is a cross-sectional diagram showing how a graphene element can be combined with a ridge waveguide in an integrated circuit environment.

FIG. 24B is a cross-sectional diagram showing how a graphene element can be combined with a slot waveguide in an integrated circuit environment.

Figure 25A:
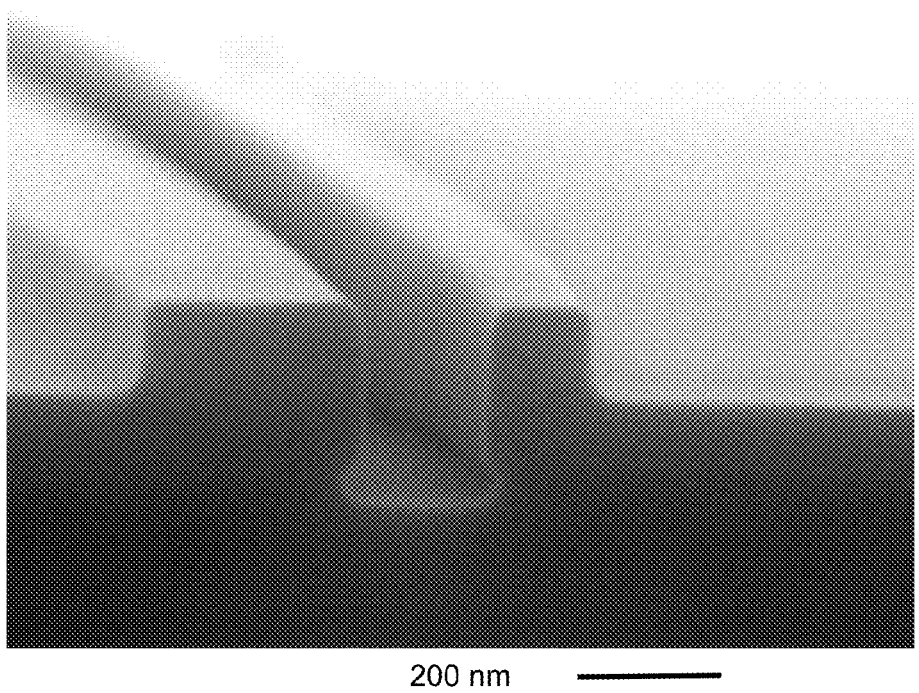
FIG. 25A is an image that shows a SEM cross-section of a slot guide.

FIG. 25A is an image that shows a SEM cross-section of a slot guide.

Figure 25B:
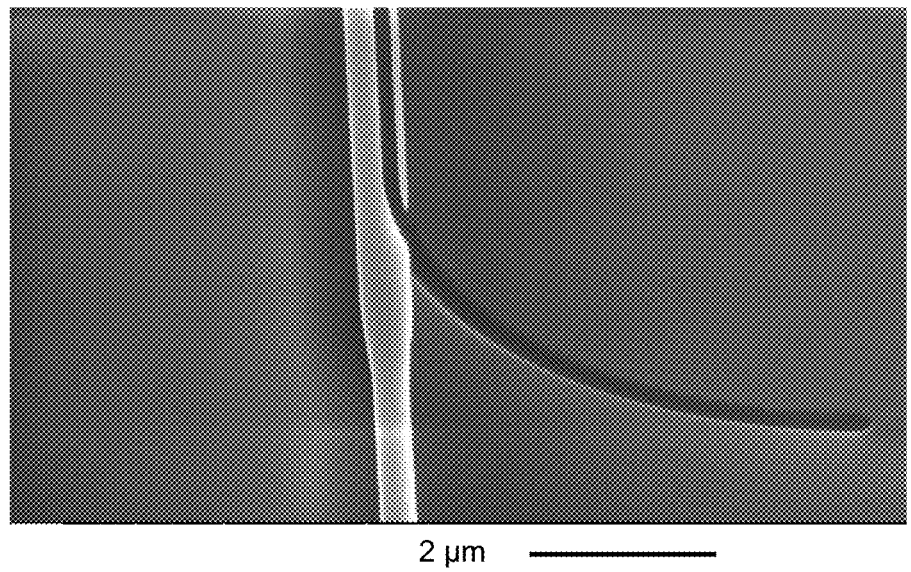
FIG. 25B shows a plan view of a ridge-to-slot coupler.

FIG. 25B shows a plan view of a ridge-to-slot coupler.

Figure 25C:
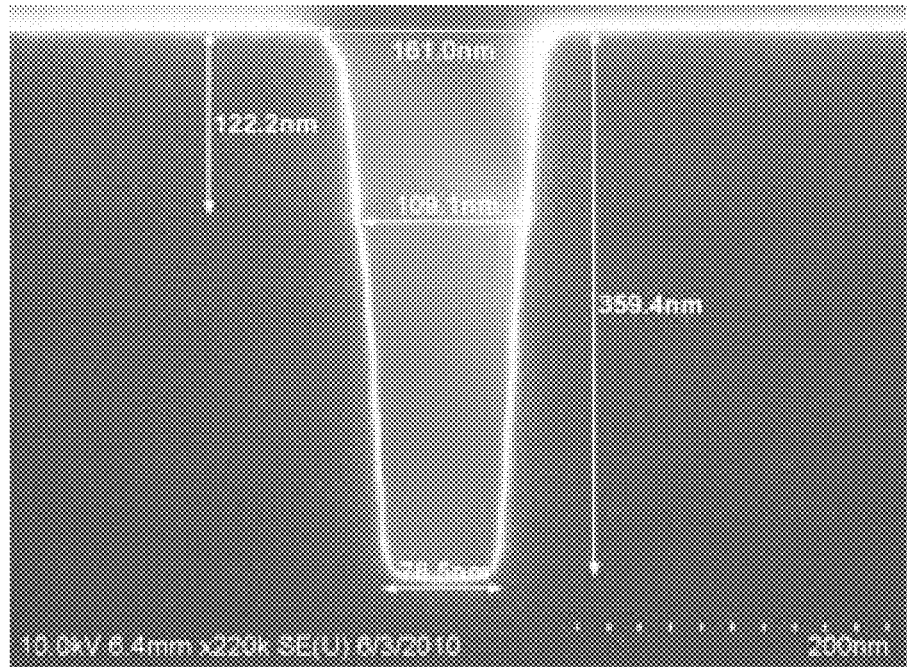
FIG. 25C shows a zoomed view of a slot.

FIG. 25C shows a zoomed view of a slot.

Slot waveguide devices provide an opportunity to integrate novel materials which are evanescently coupled to low-loss silicon waveguides. The images of FIG. 25A, FIG. 25B, and FIG. 25C show devices fabricated with 248 nm stepper-based lithography, and highlight the possibility of creating sub-resolution structures (110 nm trench from the BAE process in FIG. 25C) with such techniques. Optical fields are highly concentrated in the slot, and interact strongly with any material therein.

Figure 26A:
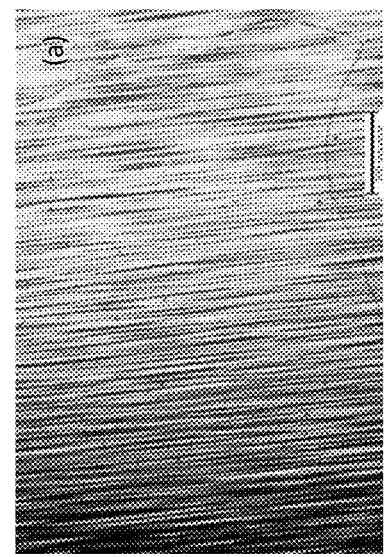
FIG. 26A is a microscope image of as-grown graphene on a copper foil.
Figure 26B:
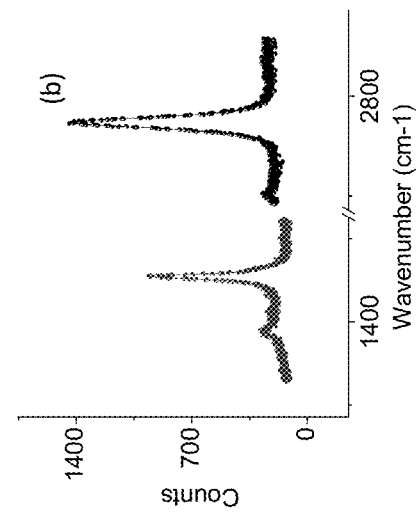
FIG. 26B is a graph showing a Raman spectrum of CVD graphene that indicates a high quality monolayer graphene.
Figure 26C:
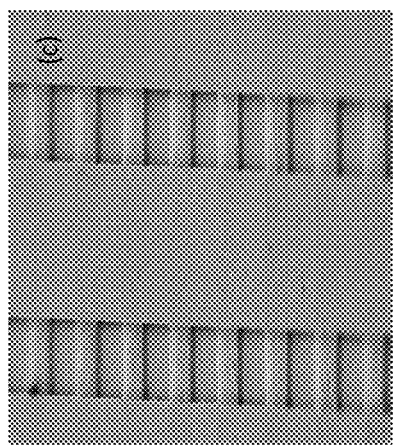
FIG. 26C shows SEM images of arrays of suspended graphene membrane devices.

Fortunately, the mass production of graphene by the chemical vapor deposition (CVD) method has been discovered recently, using transition metals such as Ni and Cu. One can use CVD method to grow graphene on Cu foils. FIG. 26A shows a microscope image of as-grown single-layer graphene on Cu. The associated Raman spectrum (FIG. 26B) shows the high quality of the monolayer graphene. The large-scale graphene growth by CVD allows mass production of graphene devices. Compared to a few devices per fabrication run using exfoliated graphene, we are now able to produce thousands of devices per fabrication run using CVD graphene. FIG. 26C is an example SEM image of suspended graphene membrane devices. The ability of mass-production of devices enables the investigation of unprecedented graphene device physics and applications, such as grain boundary engineering, Drude conductivity of graphene in THz regime, graphene resonator physics, graphene transparent electrodes, and graphene solar cells.

Graphene Atomic Membrane Photodetector

The outstanding electronic and optical properties make graphene a promising candidate for novel photodetector applications. Photocurrent (sometime referred to herein using the acronym "PC") generation is a key process in photodetectors. The incident photon excites an electron from the conduction band to the valence band. The collection of electrons (holes) gives rise to PC. Conventional materials for photodetectors exhibit a bandgap. Detectors made of those materials only work for certain, narrow wavelength windows; very broadband detectors are extremely desirable for applications in UV, FLIR and other infrared sensing modalities. No other materials can cover such a wide spectral regime, and those materials often only work well at low temperatures. Monolayer graphene has remarkable 10% light absorption at UV and universal 2.3% light absorption from visible to infrared at room temperature, the strongest of all known materials. Combined with the unmatchable in-situ tunable optoelectronic properties, graphene is an excellent material for broadband light detection, especially if the light can be directed into the plane of the graphene layer.

There has been tremendous interest in graphene photodetectors in the recent past. In 2008, Lee et al. for the first time demonstrated a pronounced PC response at graphene-metal contact using visible laser excitation. The polarity of PC can be tuned by varying the Fermi level of graphene using a capacitive coupled silicon back gate. An IBM research group designed a multi-electrode graphene device to achieve photoresponsivity of 6.1 mA/W with 1.55 um photon excitation. The lower bound detection bandwidth was also characterized at visible wavelength. By modulating the incident light intensities and detecting the PC at the modulation frequency, PC response does not degrade at least up to 40 GHz, which is only limited by the speed of their optical modulators. Further calculation based on RC time constant indicates that graphene photodetector has a intrinsic bandwidth of ~500 GHz.

The direct measurement of detector bandwidth described above will have difficulties in quantifying the intrinsic bandwidth of the physical effect underlying the detector because the measurement is limited by the maximum light modulation rate and the bandwidth of the read-out electronics, which are not trivial to improve. Further, this type of measurement does not provide insights into PC dynamics such as the role of photon-phonon interactions in device optoelectronic responses. One can take an alternate approach, optical pump and probe techniques, to surmount these challenges. The auto-correlation type measurement will directly map out the PC dynamics with DC measurements. Thus it not only provides deep physical insights of the PC generation and carrier dynamics, but also reveals the intrinsic bandwidth of graphene photodetectors.

We have performed two-pulse pump-probe measurements at a multilayer graphene-metal contact junction. The preliminary results, displayed in FIG. 20, show the PC decays to its half-peak value around 10 ps. This indicates the intrinsic bandwidth is on the order of 100 GHz. The decay process is more complicated than a simple exponential process. One can expect that future measurements will focus on understanding the physics associated with PC dynamics by exploiting larger parameter space, such as device sizes, carrier doping, temperatures, graphene thickness, and substrate effects.

Unlike semiconductors, since the conduction and valence band touch each other at the Dirac point, graphene has no bandgap. An outstanding challenge for graphene photodetectors is to pin down the exact physical mechanism giving rise to the observed PC. The above measurements are all done on graphene-metal contacts. The Schottky diode physics is adopted to interpret the data, i.e. the photo-excited electron hole pair is separated by built-in electrical fields and generates PC. However, recent transport measurements demonstrated the thermoelectric effect in graphene transistor devices, which suggests the photothermoelectric effect may play an important role in PC generation in graphene devices.

In order to elucidate this problem, one can study a junction formed at a single and bilayer graphene interface (FIG. 27A). This design excludes the complex effects from metal contact. More importantly, the two mechanisms, photoelectric and photo-thermoelectric, predict different signs of the photocurrent. FIG. 27B and FIG. 27C show respectively the PC and its device images, which clearly demonstrated a pronounced PC generation at graphene interface junction. We can control the polarity and amplitude of PC as a function of gate voltage. The data are shown in FIG. 37D, which can be interpreted by the photo-thermoelectric model (FIG. 37E). Further measurements on the power and temperature dependence of PC can be also well explained by the photo-thermoelectric model. We use these measurements to infer the thermal conductivity of the graphene. We find a $T^{1.5}$ dependence below 100K, which suggests the out-of-plane acoustic phonon mode dominates the thermal conductivity. Our work has potential impact for designing graphene based optoelectronics, such as photo-thermocouple devices and photovoltaics. We also show that PC microscopy can be a local probe of the density of states, which could be potentially useful for studying novel phenomena from graphene interface nanostructure.

All current graphene optoelectronic research focusses on visible and near infrared regime. We expect to exploit PC generation and its dynamics in an ultra-broad spectral range, from deep UV to 10 mm, for potential innovative broadband, high speed, and energy efficient graphene optoelectronics.

Graphene Nanoribbon Optoelectronics

One unique physical property of graphene membrane is that the electronic structure can be tuned by shape-engineering. Functional electronic devices, such as transistors and PN junctions, require materials with bandgaps. However, as mentioned hereinabove, pristine graphene is a semimetal without electronic bandgaps. One solution to this challenging feature is to shape 2D graphene membranes into quasi 1D narrow ribbons (see FIG. 22C and FIG. 28A). When the width of graphene is reduced to nanometer scale, the lateral constriction of the nanoribbon quantizes the electron wave functions, thus leads to electronic bandgap. The size of the bandgap depends on the width and edge atomic structure of nanoribbons.

The fabrication of nanoribbons has been intensively studied in the last few years. It has turned out to be nontrivial to engineer narrow ribbons. Early experiments patterned graphene with EBL photoresist HSQ and then etched the graphene into nanoribbons. This method is likely to introduce defects into the nanoribbon. Later on, a few groups developed the method of unzipping nanotubes into graphene nanoribbons. High quality graphene narrow ribbons can be produced with this method. However ribbons produced by this method have relatively large width (~20 m) and thus smaller bandgap effects. Recently, a bottom-up chemical method was discovered to synthesize graphene nanoribbons. Mass graphene nanoribbons can be fabricated with sub 10 nanometer width. Currently, this method cannot produce long graphene nanoribbons. Dai's group at Stanford also developed a gas-phase etching procedure to produce sub 10 nm graphene nanoribbon. This top-down approach can produce well-patterned arrays of nanoribbon, which demonstrated $10^4$ on and off ratio of a graphene field-effect-transistor at room temperature.

Figure 28E:
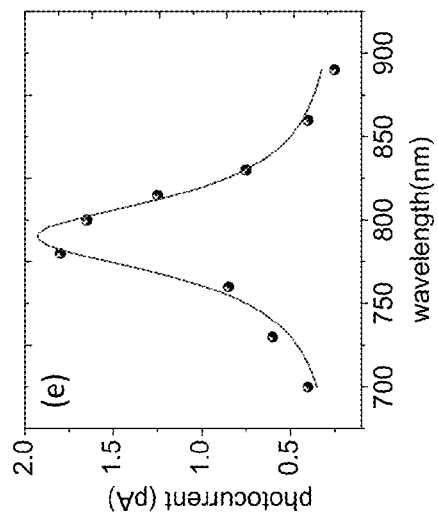
FIG. 28E is a graph of photocurrent amplitude that shows a strong dependence on the laser wavelength.
Figure 28F:
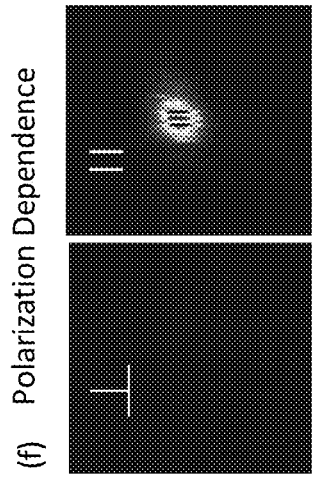
FIG. 28F is an image that shows a highly polarized photocurrent response. On the left panel the laser is polarized perpendicular (denoted ⊥) to the optical dipole antenna suppressing the plasmon excitation. On the right panel the laser is polarized parallel (denoted ∥) to the dipole antenna giving rise to maximum photocurrent.
Figure 28C:
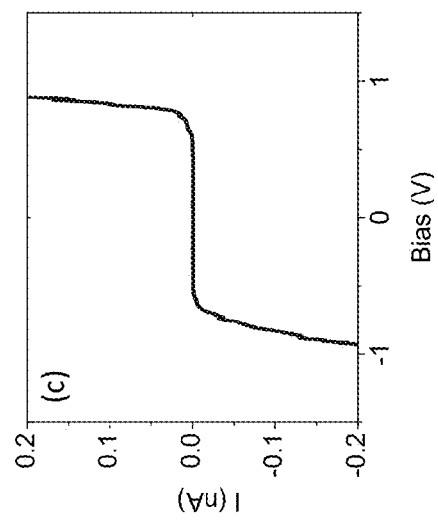
FIG. 28C is a graph showing an electrical transport measurement that demonstrates the creation of graphene potential barrier.
Figure 28D:
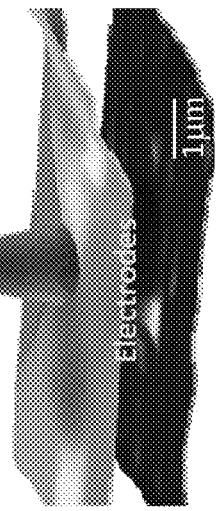
FIG. 28D is a 3D image of generated photocurrent on top of the device image. A sharp photocurrent arises in the gap.
Figure 28A:
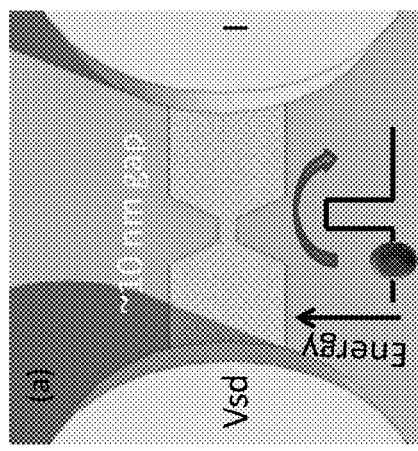
FIG. 28A is a schematic diagram illustrating device structure. Gold electrodes with sub 10 nm separation form an optical dipole antenna. A graphene nanoribbon connects the electrodes. The ~1 nm graphene nano-constriction in the center forms a tunnel barrier. The inset shows an electron tunnel through the tunnel barrier.
Figure 28B:
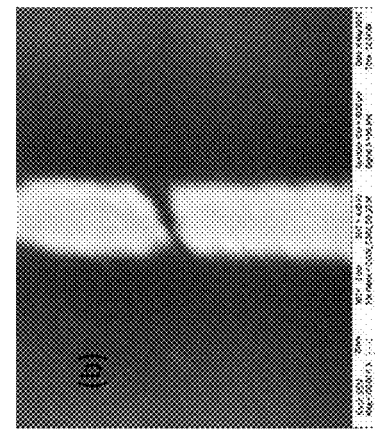
FIG. 28B is a SEM image of a fabricated device shows ~10 nm gap between two Au electrodes.
Figure 29A:
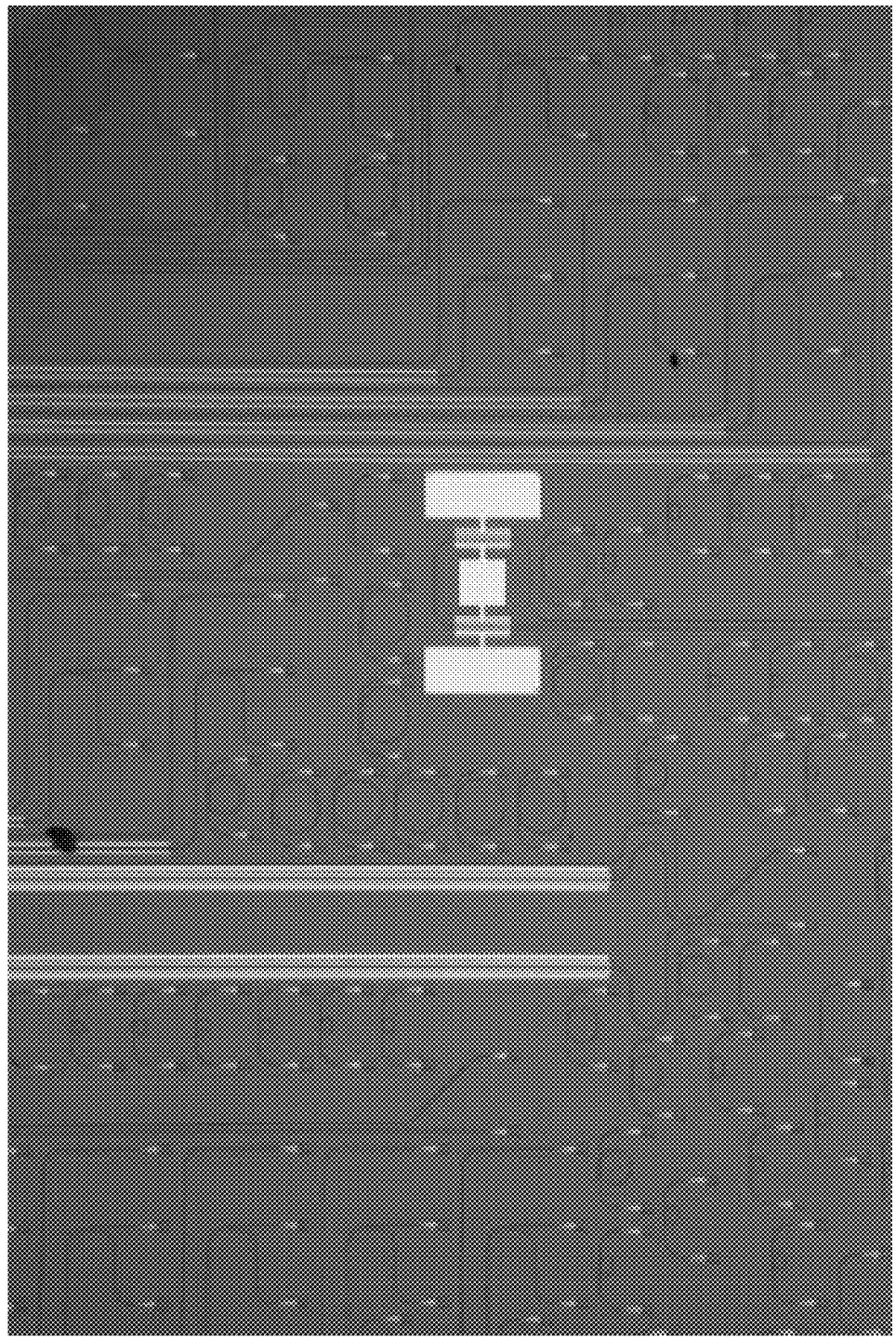
FIG. 29A is an image of one embodiment of an electroded slot waveguide EO modulator, ready for graphene coating and electrical testing.
Figure 29B:
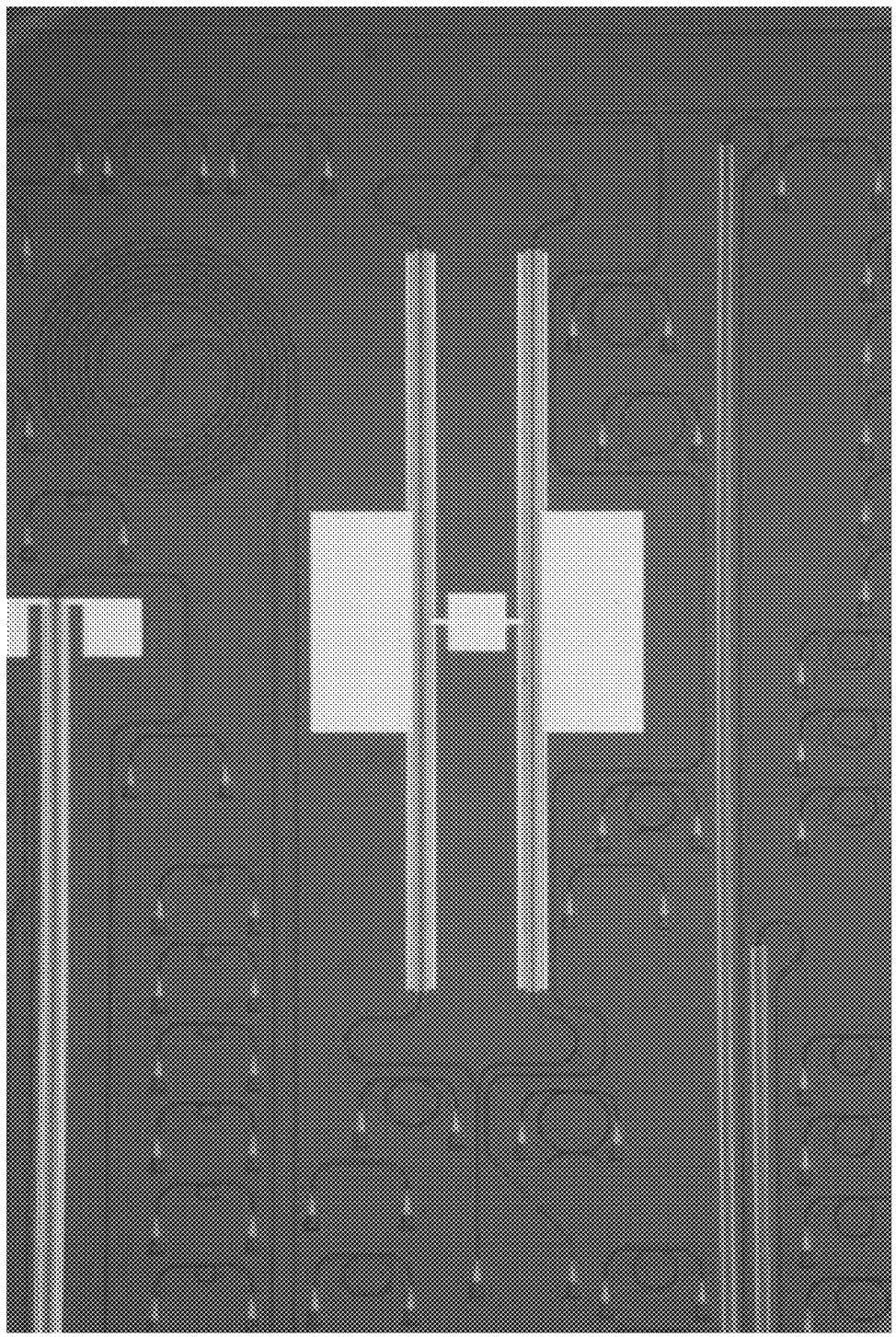
FIG. 29B is an image of another embodiment of an electroded slot waveguide EO modulator, ready for graphene coating and electrical testing.

With all this exciting research progress, it is still a great challenge to measure the optoelectronic properties of graphene nanoribbon devices. It is also non-trivial but extremely desirable to integrate the graphene nanoribbon into other nanoscale structures for developing innovative optoelectronic devices. We recently successfully integrated graphene nanoribbon into a plasmon optical antenna structure as shown in FIG. 28A and FIG. 28B). We demonstrated plasmon-enhanced optical rectification effect through the graphene nano-constriction tunnel barrier. The optical antenna is formed by a nanometer Au-break junction gap (FIG. 28B). The tunnel barrier feature is characterized by electrical transport measurements (FIG. 28C). Using the scanning photocurrent microscopy, we have demonstrated an optical rectification effect from this plasmonic structure (FIG. 28D). The plasmon enhanced PC showed strong dependence on laser wavelength (FIG. 28E) and polarization (FIG. 28F), which are trademarks of plasmonic optical antennas. Due to the tunnel barrier nature, the device response time is determined by the carrier tunneling time, which could be even faster than optical cycle. Thus, we expect this plasmonic circuit to be an ultrafast (~100 THz) photodetector. The next experimental challenge is to characterize the device detection bandwidth.

We expect to fabricate suspended graphene nanoribbon PN junctions for novel optoelectronics devices, including room-temperature photodetectors for the mid-infrared. The quasi-1D nature of graphene nanoribbons makes it a similar electronic system as carbon nanotubes. Recently, the McEuen group has shown a surprising multiple electron-hole generation process in a carbion nano-tube (CNT) photodiode. This result also motivates us to look for impact ionization process in nanoribbon PN junction systems. Observing this effect may impact next generation energy harvesting technologies.

Hybrid Graphene-Silicon Waveguide Optoelectronics

Chip scale integration of ultrafast photonics and electronics within the same chip-scale platform represents a coming technological revolution of enormous economic and societal impact.

First generation silicon photonic circuits are already having a substantial impact on both defense and commercial applications. A single-chip radio-frequency front-end has been developed which replaces two entire 19" racks of conventional RF and photonic components, and provides better performance than the discrete solution. At Luxtera, a company co-founded by one of the inventors, the first product is a 40-gigabit per second data cable, with electrical headers, that can transmit bi-directional data over hundreds of meters. It is expected that further applications will range from multi-terabit, low-latency optical data links for supercomputing to extraordinarily high-bandwidth and low-cost components for millimeter-wave and terahertz signal processing.

The first generation of silicon photonics has already produced commercial products for digital data communications, with chips integrating thousands of optical components with hundreds of thousands of transistors. In digital data communication applications, for which it is adequate to manipulate populations of carriers in order to locally modify the index of refraction, and to rely on material absorption for optical detection—these are both well-known and well-understood effects, making the implementation of CMOS electronic-photonic integrated systems at speeds below 20 Gbit/second largely an exercise in management of complexity, rather than one requiring fundamental innovations.

Because of the unique ability to mass-produce nanoscale structures in CMOS silicon, and the availability of control electronics directly on-board, the silicon platform offers a unique system for forcing photons to interact very strongly with other photons. Such interactions are naturally quite small, because photons, as bosons, tend to interact weakly—this has meant historically that ultrafast nonlinear optical systems have needed long path lengths and have required sensitive optical alignment. With nanoscale waveguide features, it has proved possible to use silicon waveguides to demonstrate several first results for potentially transformative nonlinear optical devices that could not be realized in any fiber-based or free-space optical system. Because of the very high field concentrations and low losses available within the silicon photonic system, and the feasibility of coupling these silicon guides to novel, highly engineered organic nonlinear optical materials, the silicon platform offers the first real hope of a practical platform for all-optical computing at terahertz bandwidth.

With very large scale integrated (VLSI) electronics and complex photonics on the same platform, it becomes possible to make devices that are different in kind from what could be done with either capability alone. To take another example, chip-scale systems for biosensing, chemical sensing, all-optical interrogation of ultra-low noise sensors, and many others, can be built on top of a silicon photonics-electronics integrated platform. These applications rely on integration of organic materials which provide molecular specificity with the silicon photonics, providing extraordinary sensitivity. By bringing nanomechanical functionality into the silicon waveguide system we can construct systems with world-leading sensitivity to mechanical motion. This technology is likely to find use in constructing extremely sensitive measurement apparatus for vibration, acceleration, and applications in fundamental condensed matter physics. Adding released graphene to the silicon waveguide system will provide a pathway to all of these potential applications.

There has been significant progress on building individual optical devices and small integrated systems within the silicon platform, primarily aimed at data transmission applications. Many of the components of a communications system, operating at speeds below 20 gigahertz, have already been demonstrated both in academia and in industry. These devices include high-Q optical cavities, electrooptic modulators based on manipulating carrier density, slow-light architectures for optical memory, optically pumped silicon lasers, optical detectors at 1550 nm, optical parametric amplifiers, Raman lasers, optical logic in the high megahertz range, evanescently coupled lasers, and a wide variety of photonic crystal based waveguides and resonators. Over the past several years, we have shown that nanostructured silicon photonic waveguides, infiltrated with engineered organic cladding materials, provide a remarkable platform for nonlinear optics. Polymer-clad slot guides have been used to create a variety of devices with world-record performance, including in particular the world's lowest-voltage electrooptic modulators, optical-rectification based detectors and Pockels' Effect based ring-modulators, and all-optical modulators with more than 1 THz of signal bandwidth.

We have developed silicon waveguides which can be evanescently coupled to a variety of cladding materials. In particular, we have developed nano-slot wave guides that are clad with electrooptic and Kerr-effect nonlinear optical polymers. Such polymers exhibit nonlinear optical properties that are as much as an order of magnitude stronger than conventional nonlinear optical materials, such as lithium niobate, and are the strongest ultrafast nonlinear optical materials in the world by an order of magnitude. The slot waveguides, because of their nanoscale features, concentrate optical modes into areas that are orders of magnitude smaller than those of single-mode optical fibers. Their enormous concentration of optical energy, located in the slot, translates into a dramatic enhancement of the electric field associated with the optical mode. This enhanced field is located not in the silicon, but in the slot region, which is filled with electrooptic organic material with greatly enhanced optical nonlinearity. As a result, the figure of merit associated with these waveguides, when filled with active nonlinear materials, is orders-of-magnitude higher than that achieved in any alternative system. We expect to use these same slot guides to make nanoscale released graphene membranes, with lateral dimensions of less than 100 nm, and thicknesses of a single atomic monolayer. These represent an ultimately scaled nano-membrane in two dimensions.

Within this system, we have demonstrated world-record results in terms of both low-voltage electrooptic modulation and high bandwidth all-optical modulation, showing devices with bandwidths well into the Terahertz range. The electrooptic devices hold the promise of revolutionizing the design and implementation of a wide variety of radio-frequency and millimeter-wave systems, in fields from data communication to electronic warfare. The terahertz all-optical modulators that we've developed represent a major milestone on the path toward building true ultrafast all-optical logic on chip, at bandwidths 10-100 times what is achievable in electronic circuits. Because of its very large third order nonlinearity, graphene is a promising candidate to replace organic materials in these all-optical applications.

We have shown that it is possible to fabricate ultra-low loss contacted slot waveguides, with losses on the order of 1 dB/cm. We expect to coat graphene onto these structures, so that we can probe the devices both electrically and optically at wavelengths in the near infrared around 1.5 μm. In addition, we have demonstrated low-loss waveguiding in ridge guides out to around 5.5 μm wavelengths, and one can explore the possibility of creating contacted slot guides at these longer wavelengths.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An apparatus for modulating light with light, comprising:
 a substrate having an insulating surface;
 a high index contrast waveguide adjacent said insulating surface, said high index contrast waveguide having a first input port for receiving a first input light beam having a first frequency, a second input port for receiving a second input light beam having a second frequency different from said first frequency, a third input port for receiving a third input light beam with a third frequency different from at least one of said first and second frequencies, and an output port for providing an output light beam; and a graphene cladding adjacent said high index contrast waveguide;

said high index contrast waveguide and said graphene cladding configured so that, when said first input light beam is provided as a first continuous-wave laser beam having a first frequency, and said second input light beam is provided as a second continuous-wave laser beam having a second frequency, said output light beam appearing at said output port includes a modulated signal at said third frequency having a modulation frequency equal to a difference between said first frequency of said first input light beam and said second frequency of said second input light beam.

2. The apparatus for modulating light with light of claim 1, wherein one of said first continuous-wave laser beam and said second input light beam is amplitude modulated.

3. The apparatus for modulating light with light of claim 1, wherein said first and second input light beams are provided at the same input port.

4. An apparatus for modulating light with light, comprising:

a substrate having an insulating surface;

a high index contrast waveguide adjacent said insulating surface, said high index contrast waveguide having a first input port for receiving a first input light beam having a first frequency, a second input port for receiving a second input light beam having a second frequency different from said first frequency, and an output port for providing an output light beam; and a graphene adjacent said high index contrast waveguide;

said high index contrast waveguide and said graphene cladding configured so that, when said first input light beam is provided with an amplitude modulation at a predefined frequency, and said second input light beam comprises no amplitude modulation, an output light beam includes an amplitude modulation at said predefined frequency on said second light beam at said second frequency.

5. The apparatus for modulating light with light of claim 4, wherein said apparatus is an optical transistor.

6. The apparatus for modulating light with light of claim 4, wherein said substrate is a silicon wafer.

7. The apparatus for modulating light with light of claim 6, wherein said insulating surface is a layer comprising silicon and oxygen.

8. The apparatus for modulating light with light of claim 7, wherein said high index contrast waveguide adjacent said insulating surface is silicon.

9. The apparatus for modulating light with light of claim 4, wherein said high index contrast waveguide is configured as a Mach-Zehnder interferometer having at least two arms.

10. The apparatus for modulating light with light of claim 9, wherein said first and said second input light beams interact in one arm of said Mach-Zehnder interferometer.

11. The apparatus for modulating light with light of claim 4, further comprising an optical cavity that enhances an optical field strength of at least one optical beam.

12. The apparatus for modulating light with light of claim 11, wherein said optical cavity that enhances an optical field strength of at least one optical beam comprises a ring configuration.

13. The apparatus for modulating light with light of claim 11, wherein said optical cavity that enhances an optical field strength of at least one optical beam comprises a grating configuration.

14. The apparatus for modulating light with light of claim 11, wherein said optical cavity that enhances an optical field strength of at least one optical beam comprises a Fabry-Perot configuration.

15. The apparatus for modulating light with light of claim 4, wherein one of said first input light beam and said second input light beam comprises a combination of a first pump light beam having a first pump frequency and a second pump light beam having a second pump frequency, said combination of said first pump light beam and said second pump light beam providing a modulation source beam having a selected frequency corresponding to a difference between said first pump frequency and said second pump frequency.

16. An optical logic gate comprising at least one apparatus for modulating light with light of claim 4.

17. The optical logic gate of claim 16, wherein said logic gate is configured as a NAND gate.

18. The optical logic gate of claim 16, wherein said logic gate is configured as a XOR gate.

19. A latch comprising at least one optical logic gate of claim 16.

20. The optical logic gate of claim 16, wherein said logic gate is configured as an AND gate.

21. The optical logic gate of claim 16, wherein said logic gate is configured as an OR gate.

22. An optical detector comprising:

a substrate having an insulating surface;

a high index contrast waveguide adjacent said insulating surface, said high index contrast waveguide having an input port for receiving an input light beam having a first frequency and an output port for providing an output signal; and a graphene cladding adjacent said high index contrast waveguide;

said optical detector configured to provide a signal at said output port representative of said input light beam.

23. A nanoelectromechanical device, comprising:

a substrate having an insulating surface;

a high index contrast waveguide adjacent said insulating surface, said high index contrast waveguide having an input port for receiving a non-volatile input electromagnetic signal and an output port for providing an output signal; and a graphene cladding proximate said high index contrast waveguide, said graphene cladding configured to perform a mechanical motion in response to said non-volatile input electromagnetic signal;

said nanoelectromechanical device configured to provide a non-volatile output signal at said output port representative of said non-volatile input electromagnetic signal.

24. A method of optically processing light, comprising the steps of:

providing a structure comprising:

a substrate having an insulating surface, a high index contrast waveguide adjacent said insulating surface, said high index contrast waveguide having a first input port for receiving a first input light beam having a first frequency, a second input port for receiving a second input light beam having a second frequency different from said first frequency, a third input port for receiving a third input light beam having a third frequency different from at least one of said first frequency and said second frequency, and an output port for providing an output light beam; and a graphene cladding adjacent said high index contrast waveguide;

providing a first continuous-wave laser beam having a first frequency;

providing a second continuous-wave laser beam having a second frequency different from said first frequency, providing a third continuous-wave laser beam having a third frequency different from at least one of said first frequency and said second frequency; and observing an output light beam at said output port, said output light beam including a modulated signal at said third frequency having a modulation frequency equal to a difference between said first frequency of said first input laser beam and said second frequency of said second input laser beam.

25. The method of claim 24, wherein at least two of said first, said second and said third input light beams are provided at the same input port.

26. The method of optically processing light of claim 24, wherein at least one of the steps of providing a first input laser beam having a first frequency, providing a second input laser beam having a second frequency different from said first frequency and providing a third continuous-wave laser beam having a third frequency different from at least one of said first frequency and said second frequency involves providing an input laser beam using an input waveguide that communicates with said high index contrast waveguide with a coupler.

27. A method of optically processing light, comprising the steps of:

providing a structure comprising:

a substrate having an insulating surface, a high index contrast waveguide adjacent said insulating surface, said high index contrast waveguide having a first input port for receiving a first input light beam having a first frequency, a second input port for receiving a second input light beam having a second frequency different from said first frequency, and an output port for providing an output light beam;

and a graphene cladding adjacent said high index contrast waveguide;

providing a first input light beam having a first frequency, and having an amplitude modulation at a predefined frequency;

providing a second unmodulated input light beam having a second frequency different from said first frequency, and observing an output light beam having an amplitude modulation at said predefined frequency on said second light beam at said second frequency.

28. The method of optically processing light of claim 27, wherein at least one of the steps of providing a first input light beam having a first frequency and providing a second input light beam having a second frequency different from said first frequency involves providing either input light beam using an input waveguide that communicates with said high index contrast waveguide with a coupler.

\* \* \* \* \*